US012595409B2

(12) United States Patent
Wang et al.

(10) Patent No.: US 12,595,409 B2
(45) Date of Patent: Apr. 7, 2026

(54) HIGH LUMINOUS EFFICACY PHOSPHOR CONVERTED WHITE LEDS

(71) Applicant: Bridgelux, Inc., Fremont, CA (US)

(72) Inventors: Gang Wang, Sunnyvale, CA (US); Yi-Qun Li, Danville, CA (US)

(73) Assignee: Bridgelux, Inc., Fremont, CA (US)

( * ) Notice: Subject to any disclaimer, the term of this patent is extended or adjusted under 35 U.S.C. 154(b) by 895 days.

(21) Appl. No.: 17/805,458

(22) Filed: Jun. 4, 2022

(65) Prior Publication Data

US 2022/0389313 A1      Dec. 8, 2022

Related U.S. Application Data

(60) Provisional application No. 63/197,311, filed on Jun. 4, 2021.

(51) Int. Cl.
| | |
|---|---|
| *C09K 11/61* | (2006.01) |
| *C09K 11/64* | (2006.01) |
| *C09K 11/77* | (2006.01) |
| *H10H 20/813* | (2025.01) |
| *H10H 20/822* | (2025.01) |

(52) U.S. Cl.
CPC .......... *C09K 11/616* (2013.01); *C09K 11/646* (2013.01); *C09K 11/77064* (2021.01); *H10H 20/813* (2025.01); *H10H 20/822* (2025.01); *C09K 2211/182* (2013.01); *C09K 2211/183* (2013.01); *C09K 2211/186* (2013.01); *C09K 2219/03* (2013.01)

(58) Field of Classification Search
CPC ................ C09K 11/616; C09K 11/646; C09K 11/77064; C09K 2211/182; C09K 2211/183; C09K 2211/186; C09K 2219/03; H10H 20/813; H10H 20/822; H10H 20/8512; H10H 20/8513; Y02B 20/00; H01L 25/0753
See application file for complete search history.

(56) References Cited

U.S. PATENT DOCUMENTS

| | | | |
|---|---|---|---|
| 7,497,973 | B2 | 3/2009 | Radkov et al. |
| 8,890,403 | B2 | 11/2014 | Sakuta et al. |
| 9,605,815 | B2 | 3/2017 | Yamakawa et al. |

(Continued)

FOREIGN PATENT DOCUMENTS

| | | |
|---|---|---|
| WO | 2017044380 A1 | 3/2017 |
| WO | 2019213644 A1 | 11/2019 |
| WO | 2020190914 A1 | 9/2020 |

*Primary Examiner* — Elmito Breval
(74) *Attorney, Agent, or Firm* — Vista IP Law Group, LLP

(57) ABSTRACT

A white light emitting device comprises: an LED that generates excitation light of wavelength from 420 nm to 480 nm; and photoluminescence materials that generate light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm. The device generates white light with a selected color temperature from 2200K to 6500K, a General Color Rendering Index, CRI Ra, of at least 80, and a Duv (Delta u, v) from 0.0060 to 0.0170 for the selected color temperature and wherein the device has an LER (Luminous Efficacy of Radiation) of at least 320 $lm/W_{opt}$.

19 Claims, 14 Drawing Sheets

(56)                References Cited

U.S. PATENT DOCUMENTS

| | | | |
|---|---|---|---|
| 10,349,484 B1 | 7/2019 | Zhang et al. | |
| 10,510,933 B1 | 12/2019 | Oh et al. | |
| 10,811,572 B2 | 10/2020 | Kim et al. | |
| 2006/0152140 A1 | 7/2006 | Brandes | |
| 2006/0208262 A1 | 9/2006 | Sakuma et al. | |
| 2008/0152933 A1 | 6/2008 | Mizuno et al. | |
| 2008/0157653 A1 | 7/2008 | Schmidt et al. | |
| 2008/0296596 A1 | 12/2008 | Setlur et al. | |
| 2009/0029775 A1 | 1/2009 | Radkov et al. | |
| 2009/0086475 A1 | 4/2009 | Caruso et al. | |
| 2010/0001648 A1 | 1/2010 | De Clercq et al. | |
| 2011/0186778 A1 | 8/2011 | Becker et al. | |
| 2011/0255265 A1 | 10/2011 | Nammalwar et al. | |
| 2012/0057100 A1 | 3/2012 | Masuda et al. | |
| 2012/0112130 A1 | 5/2012 | Wu et al. | |
| 2012/0127734 A1 | 5/2012 | Tanimoto et al. | |
| 2012/0132929 A1 | 5/2012 | Selverian et al. | |
| 2012/0155061 A1 | 6/2012 | Manabe et al. | |
| 2013/0188333 A1 | 7/2013 | Ooya et al. | |
| 2013/0241396 A1 | 9/2013 | Hiramatsu et al. | |
| 2013/0264937 A1 | 10/2013 | Sakuta et al. | |
| 2014/0168943 A1 | 6/2014 | Peeters et al. | |
| 2014/0264418 A1 | 9/2014 | Murphy et al. | |
| 2014/0340890 A1 | 11/2014 | Hata et al. | |
| 2015/0035430 A1 | 2/2015 | Yoshida et al. | |
| 2015/0061489 A1 | 3/2015 | Gu et al. | |
| 2015/0084075 A1 | 3/2015 | Watanabe | |
| 2016/0116124 A1 | 4/2016 | Podowitz et al. | |
| 2016/0133799 A1 | 5/2016 | Park et al. | |
| 2016/0223146 A1 | 8/2016 | Vick et al. | |
| 2016/0276549 A1 | 9/2016 | Yamashita et al. | |
| 2016/0316527 A1 | 10/2016 | Allen et al. | |
| 2017/0009131 A1 | 1/2017 | Wataya et al. | |
| 2017/0054059 A1 | 2/2017 | Hosokawa et al. | |
| 2017/0077360 A1 | 3/2017 | Yang et al. | |
| 2017/0250324 A1 | 8/2017 | Seki et al. | |
| 2018/0108816 A1 | 4/2018 | Todorov et al. | |
| 2018/0130928 A1* | 5/2018 | Vick | C09K 11/64 |
| 2019/0103523 A1 | 4/2019 | Choi et al. | |
| 2019/0174587 A1 | 6/2019 | Petluri et al. | |
| 2019/0254142 A1 | 8/2019 | Petluri et al. | |
| 2022/0349530 A1* | 11/2022 | Van Bommel | H01L 25/0753 |

* cited by examiner

SECTION A-A

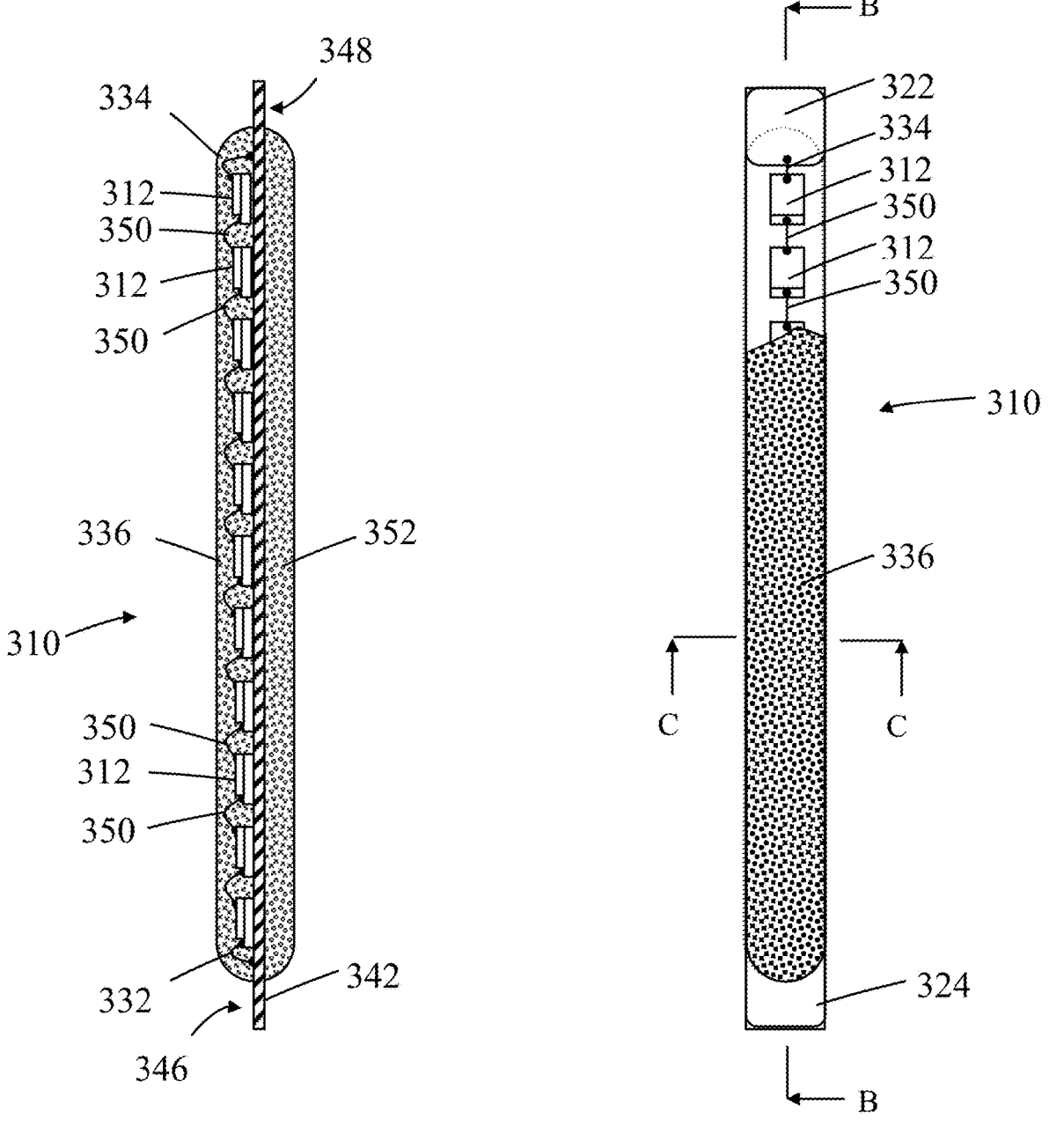
SECTION B-B
FIG. 3a          FIG. 3b

SECTION B-B

SECTION C-C

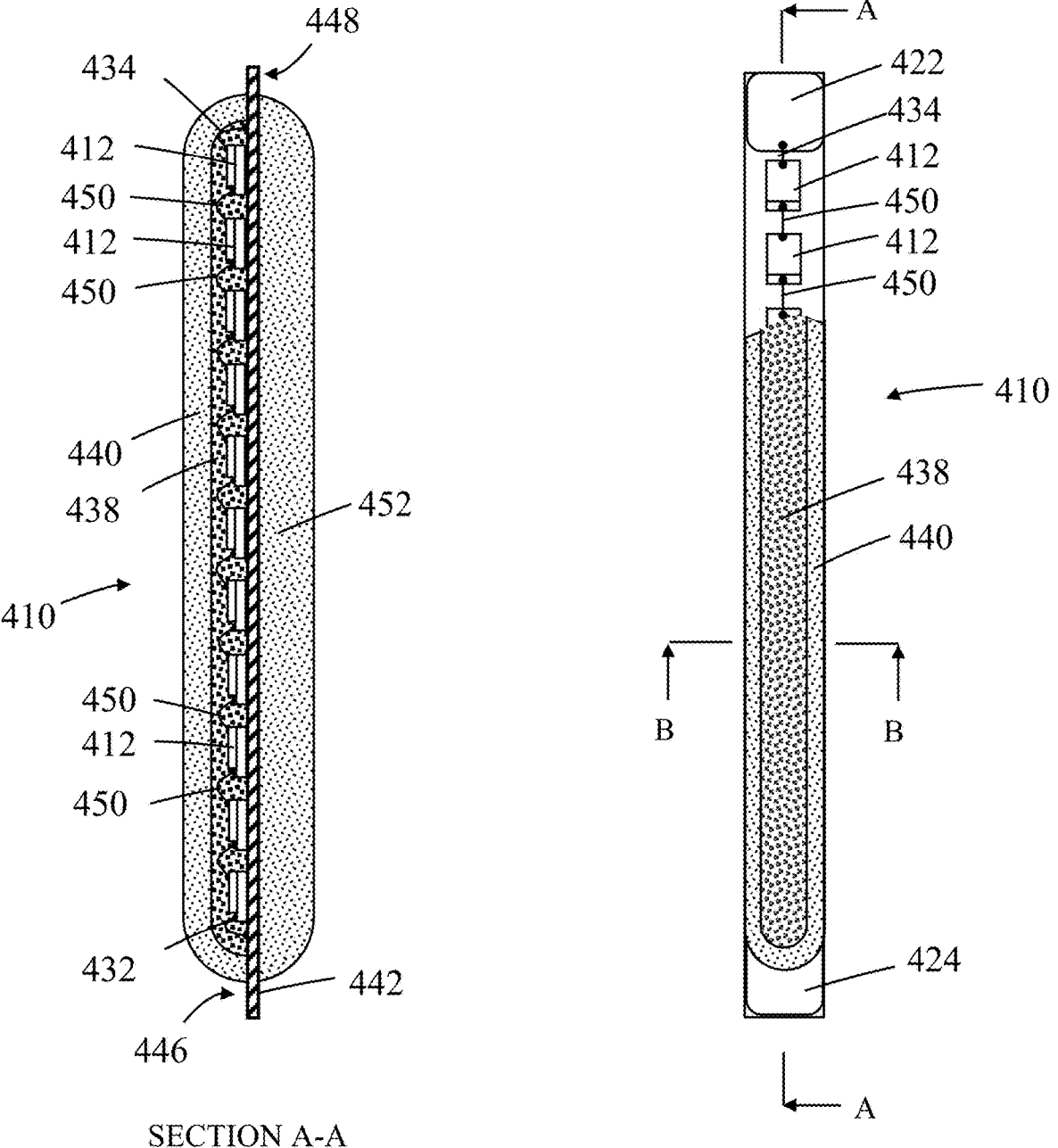
SECTION A-A
FIG. 4a                    FIG. 4b

SECTION A-A

SECTION B-B

HIGH LUMINOUS EFFICACY PHOSPHOR CONVERTED WHITE LEDS

CROSS REFERENCE TO RELATED APPLICATIONS

This application claims the benefit of priority to U.S. provisional patent application Ser. No. 63/197,311, filed Jun. 4, 2021, which is hereby incorporated by reference in its entirety.

FIELD OF THE INVENTION

Embodiments of the present invention are directed to high luminous efficacy phosphor converted white LEDs with a General Color Rendering Index (CRI Ra) of about 80 and higher. More particularly, though not exclusively, the invention concerns white LEDs with a Luminous Efficacy of Radiation (LER) of at least 320 lm/$W_{opt}$.

BACKGROUND OF THE INVENTION

White light emitting LEDs ("white LEDs") include one or more photoluminescence materials (typically inorganic phosphor materials), which absorb a portion of the blue light emitted by the LED and re-emit visible light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy, white LEDs are rapidly replacing conventional fluorescent, compact fluorescent and incandescent lamps.

Luminous efficacy is a measure of how well a light source generates visible light and is the ratio of luminous flux to power and has units of lumens per watt (lm/W). The power can be either the radiant power of light generated by the source or electrical power consumed by the source. When the power is the radiant power, the luminous efficacy is referred to as the Luminous Efficacy of Radiation (LER), often simply referred to as Luminous Efficacy (LE), and has units of lm/$W_{opt}$. When the power is electrical power, the luminous efficacy is referred to as the Overall Luminous Efficacy (OLE) of the light source or luminous efficacy of a source and has units of lm/$W_{dc}$.

In the past 15 years improvement of OLE of white LED light sources have relied on improvement of blue LED chip efficiency, phosphor efficiency, and package light extraction efficiency. During this period of the past 15 years to the present day, OLE steadily increased from 60 lm/$W_{dc}$ to 200 lm/$W_{dc}$ (LER ~300 lm/$W_{opt}$). However, blue LED chip and phosphor efficiency have pretty much reached their limit with little prospect of further improvement.

With the widespread popularity of LED lighting, the demand for white LED light sources is no longer limited to high luminous efficacy and low cost, but also requires high light quality. The General Color Rending Index (CRT), also referred to as CRT $R_a$, of a light source is currently widely used to indicate the light quality of an LED light source. Throughout this specification, "CRT" and "CRT Ra" refers to the General Color Rendering Index and the terms are used interchangeably. CRT Ra characterizes how faithfully a light source renders the true colors of an object and is based on a measure of how well a light source's illumination of eight color test samples (R1 to R8) compares with the illumination provided by a reference source. In general, the higher the value indicates its closeness to a black radiator/natural sunlight. General CRT Ra is the average value for the pastel color samples (low saturation colors R1 "Light Grayish Red" to R8 "Reddish Purple") and gives a useful measure of subtle differences in light output of incandescent sources which intrinsically generate light with a continuous spectrum that closely resembles sunlight. However, for white LEDs whose spectrum is composed of peaks, the General CRT Ra can prove to be inadequate as it is an average measure of color rendition over a limited range of colors and gives no information of the lighting source's performance for particular colors or highly saturated colors. Thus, when characterizing white LED light sources the CRT color samples R9 to R12 (saturated colors "Saturated Red", "Saturated Yellow", "Saturated Green", "Saturated Blue") and R13 to R15 ("Light Skin Tone", "Leaf Green", "Medium Skin Tone") should be considered to give a more meaningful characterization of the quality of light. It is becoming common practice in the LED lighting industry to specify values for both CRT Ra and CRT R9 (Saturated Red) as a measure of the quality of light generated by a white LED.

To increase CRT Ra and CRT R9 it is known to include orange to red light emitting phosphors. Suitable phosphor materials include europium-activated nitride compounds, for example $(Ba,Sr)_2Si_5N_8:Eu^{2+}$ (2:5:8) and $(Ca,Sr)AlSiN_3$:$Eu^{2+}$ (CASN). However, while commonly used, these phosphors have some drawbacks since their emission spectra are broad (Full Width at Half Maximum, FWHM, is approximately 75-85 nm), a large part of their emission spectrum is at wavelengths longer than 650 nm—a part of the spectrum to which the human eye is insensitive—which significantly reduces the luminous efficacy (LER) of white LEDs based on such phosphors. Most recently, it is known to also include a narrowband red phosphor such as a manganese-activated potassium silicate fluoride phosphor to alleviate this problem and increase LER to ~300 lm/$W_{opt}$ today.

The present invention arose in an endeavor to increase Luminous Efficacy of Radiation (LER) of phosphor converted white LEDs to at least 320 lm/$W_{opt}$ while maintaining a CRI Ra of at least 80.

SUMMARY OF THE INVENTION

Embodiments of the invention concern high luminous efficacy phosphor converted white LEDs in which the Luminous Efficacy of Radiation (LER) has been optimized to increase the Overall Luminous Efficacy (OLE) of the LED. More particularly, embodiments of the invention concern phosphor converted white LEDs with an LER of at least 320 lm/$W_{opt}$.

According to an embodiment of the invention a white light emitting device comprising: an LED that generates excitation light of wavelength from 420 nm to 480 nm; and photoluminescence materials that generates light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm; wherein the device generates white light with a selected color temperature from 2200K to 6500K, a General Color Rendering Index, CRI Ra, of at least 80, and a Duv from 0.0060 to 0.0170 for the selected color temperature and wherein the device has an LER (Luminous Efficacy of Radiation) of at least 320 lm/$W_{opt}$. As is known, Duv (Delta u, v) is the Euclidean difference of chromaticity coordinate uv between a test light source to the closest point on the black body locus and is defined in ANSI_NE- MA_ANSLG C78.377-2008: American National Standard for electric lamps—Specifications for the Chromaticity of Solid State Lighting Products. Duv is a measure on the 1976 CIE u, v chromaticity diagram of the distance of the color point of light of a given CCT (Correlated Color Temperature) from the Planckian locus of black body radiation (black body locus or curve) along the iso-CCT line (Lines of Constant Color Temperature). A positive Duv value indicates that the color point is above the black body locus (i.e. on a 1931 CIE x, y chromaticity diagram CIE y is greater than the CIE y value of the black body locus) with a yellowish/greenish color shift from the black body locus. A negative value the color point is below the black body locus (i.e. on a 1931 CIE x, y chromaticity diagram CIE y is less than the CIE y value of the black body locus) with a pinkish color shift from the black body locus.

In some embodiments:

when the selected color temperature is about 2700K, the device has an LER of at least 360 $lm/W_{opt}$;

when the selected color temperature is about 3000K, the device has an LER of at least 355 $lm/W_{opt}$;

when the selected color temperature is about 4000K, the device has an LER of at least 350 $lm/W_{opt}$; and when the selected color temperature is about 6500K, the device has an LER of at least 320 $lm/W_{opt}$.

In embodiments, the white light emitting device generates white light with a CRI R8 of at least 72.

In embodiments, the white light emitting device comprises a single-layer photoluminescence structure comprising a photoluminescence layer covering the LED and comprising the broadband phosphor and the manganese-activated narrowband red fluoride phosphor.

In embodiments, the white light emitting device comprises a double-layer photoluminescence structure comprising: a first photoluminescence layer covering a light emitting face the LED and consisting of the manganese-activated narrowband red fluoride phosphor; and a second photoluminescence layer comprising the broadband phosphor, wherein the second photoluminescence layer encapsulates the first photoluminescence layer.

To increase the OLE of the white light emitting device the LED can be operated at a current density from 20 $mA/mm^2$ to 120 $mA/mm^2$ (current per square millimeter of LED chip).

Preferably, the manganese-activated narrowband red fluoride phosphor comprises at least one of: $K_2SiF_6:Mn^{4+}$, $K_2TiF_6:Mn^{4+}$, and $K_2GeF_6:Mn^{4+}$.

The broadband phosphor can comprise a broadband green to yellow phosphor, a broadband orange to red phosphor and a combination of broadband green to yellow and orange to red phosphors. Advantageously, the broadband green to yellow phosphor comprises an yttrium aluminum garnet phosphor or a lutetium aluminum garnet phosphor. The broadband orange to red phosphor may comprise a calcium aluminum silicon nitride phosphor.

According to an aspect of the invention, a white light emitting device comprising: an LED that generates excitation light of wavelength from 420 nm to 480 nm; and photoluminescence materials that generates light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm; wherein the device generates white light with a selected color temperature from 2200K to 6500K, a General Color Rendering Index, CRI Ra, of at least 80, and a CIE 1976 Duv from 0.0060 to 0.0170 for a selected color temperature and wherein the device has an OLE (Overall Luminous Efficacy) of at least 210 $lm/W_{dc}$.

In some embodiments:

when the selected color temperature is about 2700K, the device has an OLE of at least 210 $lm/W_{dc}$;

when the selected color temperature is about 3000K, the device has an OLE of at least 220 $lm/W_{dc}$;

when the selected color temperature is about 4000K, the device has an OLE of at least 225 $lm/W_{dc}$; and when the selected color temperature is about 6500K, the device has an OLE of at least 220 $lm/W_{dc}$.

In embodiments, the white light emitting device generates white light with a CRI R8 of at least 72.

In embodiments, the white light emitting device comprises a single-layer photoluminescence structure comprising a photoluminescence layer covering the LED and comprising the broadband phosphor and the manganese-activated narrowband red fluoride phosphor.

In embodiments, the white light emitting device comprises a double-layer photoluminescence structure comprising: a first photoluminescence layer covering a light emitting face the LED and consisting of the manganese-activated narrowband red fluoride phosphor; and a second photoluminescence layer comprising the broadband phosphor, wherein the second photoluminescence layer encapsulates the first photoluminescence layer.

To increase the OLE of the white light emitting device, the LED can be operated at a current density from 20 $mA/mm^2$ to 120 $mA/mm^2$ (current per square millimeter of LED chip).

Preferably, the manganese-activated narrowband red fluoride phosphor comprises at least one of: $K_2SiF_6:Mn^{4+}$, $K_2TiF_6:Mn^{4+}$, and $K_2GeF_6:Mn^{4+}$.

The photoluminescence material composition can comprise a combination of broadband green to yellow and broadband orange to red phosphors. Advantageously, the broadband green to yellow phosphor comprises an yttrium aluminum garnet phosphor or a lutetium aluminum garnet phosphor. The broadband orange to red phosphor may comprise a calcium aluminum silicon nitride phosphor.

The present invention finds particular application to LED-filaments. According to embodiments of the invention, an LED-filament comprises: an at least partially light transmissive substrate having a front face; a linear array of LED chips on the front face of the substrate that generate excitation light of wavelength from 420 nm to 480 nm; and photoluminescence materials that generates light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm; wherein the LED-filament generates white light with a selected color temperature from 2200K to 6500K, a General Color Rendering Index, CRI Ra, of at least 80, and a Duv from 0.0060 to 0.0170 for the selected color temperature and wherein the device has an OLE (Overall Luminous Efficacy) of at least 210 $lm/W_{dc}$.

In some embodiments:

when the selected color temperature is about 2700K, the LED-filament has an OLE of at least 210 $lm/W_{dc}$;

when the selected color temperature is about 3000K, the LED-filament has an OLE of at least 220 $lm/W_{dc}$;

when the selected color temperature is about 4000K, the LED-filament has an OLE of at least 225 $lm/W_{dc}$; and when the selected color temperature is about 6500K, the LED-filament has an OLE of at least 220 $lm/W_{dc}$.

In embodiments, the LED-filament can comprise a double-layer photoluminescence structure on the front face of the substrate, the double-layer photoluminescence structure comprising: a first photoluminescence layer consisting of the manganese-activated narrowband red fluoride phosphor, wherein the first photoluminescence layer is a continuous unbroken elongate strip that encapsulates every LED chip on the substrate; and a second photoluminescence layer comprising the broadband phosphor, wherein the second photoluminescence layer is a continuous unbroken elongate strip that encapsulates the first photoluminescence layer.

The substrate can comprise a glass, ceramic material, sapphire, or a plastics material such as polypropylene, silicone or an acrylic sapphire.

To increase the OLE of the LED-filament the linear array of LED chips can be operated at a current density from 20 $mA/mm^2$ to 120 $mA/mm^2$ (current per square millimeter of LED chip).

Preferably, the manganese-activated narrowband red fluoride phosphor comprises at least one of: $K_2SiF_6:Mn^{4+}$, $K_2TiF_6:Mn^{4+}$, and $K_2GeF_6:Mn^{4+}$.

The broadband phosphor can comprise a broadband green to yellow phosphor, a broadband orange to red phosphor and a combination of broadband green to yellow and orange to red phosphors. Advantageously the broadband green to yellow phosphor comprises an yttrium aluminum garnet phosphor or a lutetium aluminum garnet phosphor. The broadband orange to red phosphor may comprise a calcium aluminum silicon nitride phosphor.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which:

FIGS. 3a, 3b, 3c, and 3d respectively illustrate schematic cross-sectional B-B side, partial cutaway plan, enlarged cross-sectional B-B side and cross-sectional C-C end views of a high luminous efficacy LED-filament, according to some embodiments, that comprises a single-layer photoluminescence material structure;

FIGS. 4a, 4b, 4c, and 4d respectively illustrate schematic cross-sectional A-A side, partial cutaway plan, enlarged cross-sectional A-A side and cross-sectional B-B end views of a high luminous efficacy LED-filament, according to some embodiments, that comprises a double-layer photoluminescence material structure;

DETAILED DESCRIPTION OF THE INVENTION

Figure 1A:
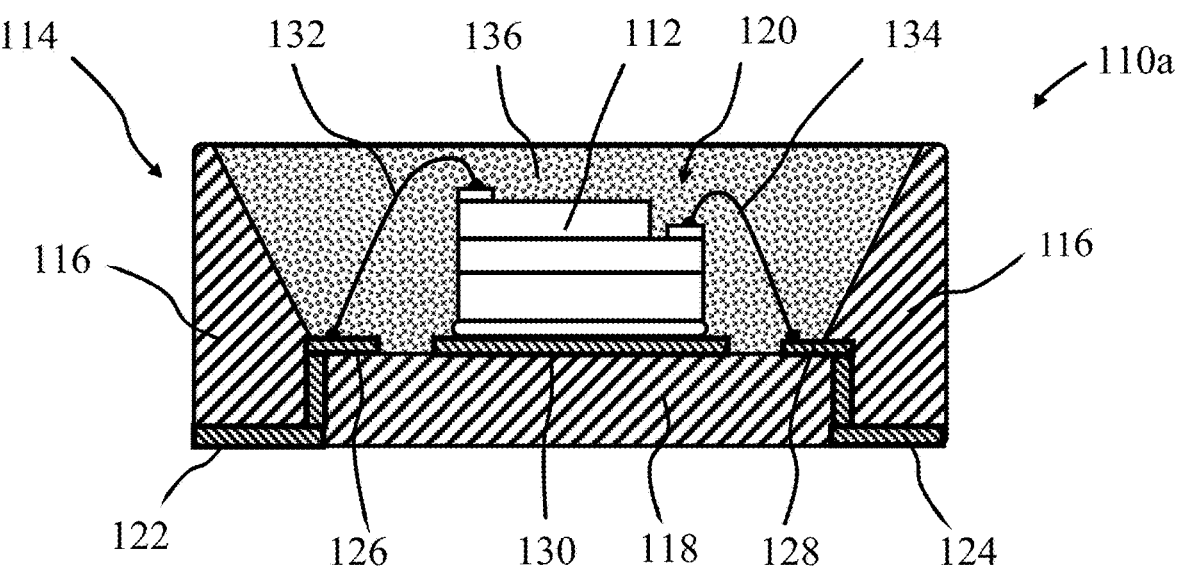
FIG. 1a is a schematic cross-sectional view of a high luminous efficacy packaged white light emitting device, according to some embodiments, that comprises a single-layer photoluminescence material structure.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Throughout this specification, like reference numerals preceded by the figure number are used to denote like features.

As described herein, with the increasing popularity of LED lighting, the demand for white LED light sources is no longer limited to high luminous efficacy and low cost, but also requires high light quality. For example, Energy Star of the United States, Title 24, and European IEC (International Electrotechnical Commission) LED Lighting Standards have set minimum CRI criteria for different lighting applications. One example requirement of the ERP (Energy Related Products) standard Class A requires an overall luminous efficacy (OLE) of a light source (lamp) of 210 $lm/W_d$, with a minimum CRI of at least 80. Taking account of power supply losses, thermal and optical losses of the lamp this may require the white LED light source to have an Overall Luminous Efficacy (OLE) of about 220 $lm/W_{dc}$. Embodiments of the present invention seek to optimize LER to attain an OLE of at least 220 $lm/W_{dc}$.

According to chromaticity and phosphor theoretical analysis, the General CRI Ra and the luminous efficacy of the light source show an inverse relationship for a given phosphor material system. For example, for white LEDs with a CCT of 3000K and a CRI of 80 and CRI 90 respectively that use different wavelengths of LuAG green phosphor and the same red nitride phosphor, the luminous efficacy of the CRI 80 LED is about 15% higher. This difference in luminous efficacy has nothing to do with the quantum efficiency of the phosphor and is due to the intrinsic difference between the two spectra.

Luminous Efficacy

As described herein, the Overall Luminous Efficacy (OLE) of a phosphor converted white LED (Device) is the ratio of luminous flux (lm) generated by the device to electrical power ($W_{dc}$) consumed by the device and is given by:

$$OLE=WPE\times CE$$

where WPE is the Wall-Plug Efficiency of the LED and CE is the phosphor Conversion Efficacy.

The WPE, or Radiant Efficiency (RE), of the LED chip is the efficiency with which the LED chip converts electrical power into radiant (optical) power and is defined as the ratio of blue light radiant flux, power, ($W_{blue}$) generated by the LED chip to the dc electrical power ($W_{dc}$) applied to the LED chip. CE is the efficiency with which the phosphor converts radiant flux, power, ($W_{blue}$) generated by the LED chip into luminous flux (lm) and is defined as the ratio of the luminous flux (lm) generated by the device to the radiant flux, power, ($W_{blue}$) generated by the LED chip.

The Conversion Efficiency (CE) is given by:

$$CE=LER\times QE\times SE$$

where LER is the Luminous Efficacy of Radiation (LER), QE is the Quantum Efficiency, and SE is the Stokes Efficiency. LER gives a measure of how well the device generates visible light (lm) and is defined as the ratio of the luminous flux (lm) generated by the device to the radiant flux, power, ($W_{white}$) generated by the device. QE is a measure of the conversion efficiency with which the device converts radiant flux generated by the LED chip to radiant flux generated by the device and is calculated by dividing the white photons ($Ph_{white}$) divided by blue photons ($Ph_{blue}$) generated by the LED chip. QE includes the phosphor quantum efficacy, scattering losses from the phosphor as well as other materials (e.g. device package). SE is calculated by dividing the white photon energy ($E_{white}$) by the blue photon energy ($E_{blue}$).

It is to be noted from the above relationships that Overall Luminous Efficacy (OLE) can on the face of it be optimized by optimizing WPE, LER, QE and/or SE. However, SE is primarily dependent on color temperature and offers little potential for improving OLE. Accordingly, the best way of optimizing OLE is by optimizing WPE, LER and QE. In particular, though not exclusively, the present invention optimizes OLE by optimizing LER through the choice of the phosphors and their relative ratio for the photoluminescence wavelength conversion, the choice of spectrum and chromaticity of the white light generated by the device, and/or optimizing WPE by for example electrically under-driving the LED chips.

According to embodiments of the invention, high luminous efficacy devices comprise an LED that generates excitation light of wavelength from 420 nm to 480 nm; and photoluminescence materials that generate light with a peak emission wavelength from 500 nm to 650 nm comprising a broadband phosphor, and a manganese-activated narrowband red fluoride phosphor with a peak emission wavelength from 628 nm to 640 nm. The device is configured to generate white light with a selected color temperature from 2200K to 6500K and a Duv from 0.0060 to 0.0170 for the selected color temperature. It is understood that by configuring the device to generate light with a positive Duv, that is the CIE y value is above the black body locus, causes the device to have an LER (Luminous Efficacy of Radiation) of at least 320 $lm/W_{opt}$. The value of Duv can be configured by selection of the proportion of broadband green to yellow phosphor to total to red phosphor (broadband orange to red+narrowband red phosphor).

High Luminous Efficacy Packaged White Light Emitting Devices

FIGS. 1a to 1d are schematic representations of high efficacy packaged white light emitting devices 110a to 110d, according to embodiments of the invention. The devices 110 have a Luminous Efficacy (LER) of at least 320 $lm/W_{opt}$ and are configured to generate white light with a CCT (Correlated Color Temperature) from 2200K to 6500K with a general CRI Ra of at least 80.

The devices 110 can comprise one or more blue light emitting InGaN/GaN-based (indium gallium nitride/gallium nitride) LED chips (dies) 112 that are housed in a package 114. The one or more LED chips generate blue excitation light of dominant wavelength from 420 nm to 480 nm, more typically 445 nm to 465 nm. The package, which can for example comprise Surface Mountable Device (SMD) such as an SMD 2835 (2.8 mm×3.5 mm cavity) LED package, comprises upper and lower body portions 116, 118 respectively. The upper body portion 116 defines a cavity (recess) 120 which is configured to receive the one or more LED chips 112. The package further comprises electrical contacts 122, 124 on the base that are electrically connected to corresponding electrode contact pads 126, 128 on the floor of the cavity 120. To enhance emission brightness of the device, the side walls of the cavity 120 are inclined and comprise a light reflective surface.

As shown in FIG. 1a, the LED chip(s) 112 can be mounted to a thermally conductive pad 130 located on the floor of the cavity 120. The thermally conductive pad 130 can be thermally connected to a thermally conductive pad (not shown) on the base of the package. The LED chip's electrode pads are electrically connected to corresponding electrode contact pads 126, 128 by bond wires 132, 134. In alternative embodiments the LED chip(s) 112 can comprise a flip-chip. As illustrated in FIG. 1a, the cavity 120 is completely filled with photoluminescence materials 136 comprising a light transmissive optical encapsulant, for example an optically clear silicone, which is loaded with a mixture of phosphor materials such that the exposed surfaces of the LED chip(s) 112 are covered by the phosphor/encapsulant material mixture. Since the phosphor materials 136 consist of a "single" layer, the photoluminescence material structure is referred to as a "single-layer" photoluminescence material structure. In accordance with embodiments of the invention, the phosphors can comprise i) a broadband green to yellow phosphor, ii) a broadband orange to red phosphor, and iii) a narrowband red phosphor (manganese-activated fluoride phosphor). Collectively, the broadband green to yellow and broadband orange to red phosphors will be referred to as broadband green to red phosphor (photoluminescence) material. Examples of suitable broadband green to yellow, broadband orange to red, and narrowband red phosphors are given below.

Figure 1B:
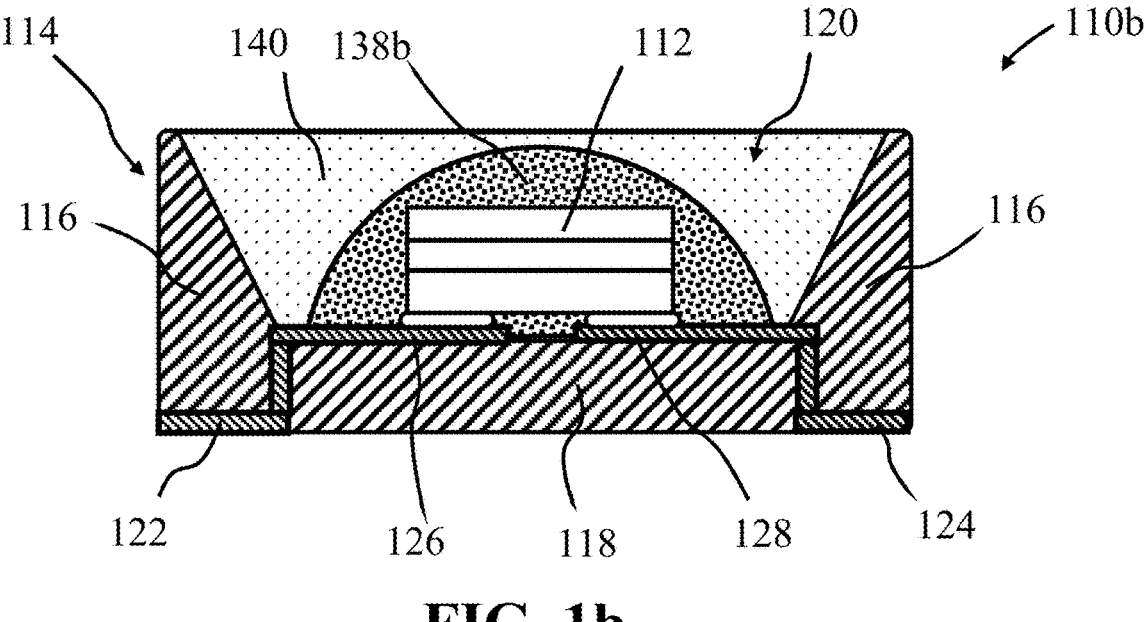
FIG. 1B is a schematic cross-sectional views of a high luminous efficacy packaged white light emitting device, according to some embodiments, that comprises a double-layer photoluminescence material structure.

FIG. 1B is a schematic cross-sectional view of a high luminous efficacy packaged white light emitting device 110b that comprises a "double-layer" photoluminescence material structure. In this embodiment, the photoluminescence material structure comprises respective first and second photoluminescence material layers 138b, 140. The first photoluminescence layer 138b is adjacent to, and encapsulates, the LED chip(s) 112 and in terms of photoluminescence material comprises only narrowband red phosphor (manganese-activated fluoride phosphor). As illustrated the first photoluminescence layer 138b can be generally hemispherical (dome-shaped) in form. The second photoluminescence layer 140 encapsulates the first photoluminescence layer 138b and comprises a mixture of broadband green to yellow and broadband orange to red phosphors. As shown in FIG. 1B the LED chip(s) 112 can be a flip-chip. The white light emitting device 110b can be manufactured by firstly depositing the first photoluminescence layer 138b onto the LED chip(s) 112 and then filling the cavity 120 with the other photoluminescence material to form the second photoluminescence layer 452. Compared with a single-layer photoluminescence structure (for example the white light emitting device of FIG. 1a) a double-layer photoluminescence structure can improve Quantum Efficiency (QE) which will improve Conversion Efficiency (CE) and hence improve Overall luminous Efficacy (OLE) of the device. In a single-layer photoluminescence structure in which the phosphors are provided as a mixture, each of the phosphor materials have equal exposure to excitation light. Since a manganese-activated fluoride phosphor material typically has a much lower blue light absorption capability than other types of phosphors (for example, a yellow to green garnet-based phosphor), a greater amount of manganese-activated fluoride phosphor is necessary to convert enough blue light to the required narrowband red emission. By contrast, in a double-layer photoluminescence structure, the manganese-activated fluoride phosphor material in its separate individual layer 138 is exposed to blue excitation light individually; thus, more of the blue excitation light from the blue LED chip(s) can be absorbed by the manganese-activated fluoride phosphor material without competition from the broadband phosphors which are located separately in the second photoluminescence layer 140 and this results in an improvement in CE. Moreover, the amount/usage of a manganese-activated fluoride phosphor required to achieve a target color point can be significantly reduced (up to 60%) compared with a single-layer photoluminescence structure providing a substantial reduction in manufacturing cost since manganese-activated fluoride phosphor is many times more expensive than broadband green to yellow and broadband orange to red phosphors.

Figure 1C:
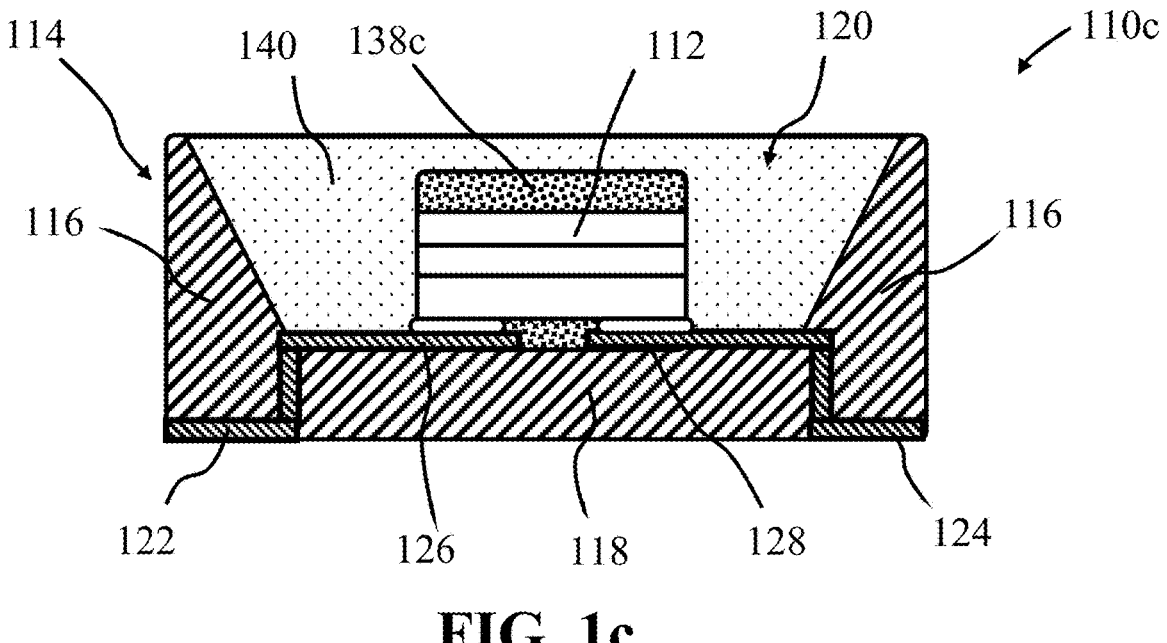
FIGS. 1c and 1d are schematic cross-sectional views of high luminous efficacy packaged white light emitting device, according to some embodiments, that comprise a double-layer photoluminescence material structure utilizing CSP (Chip Scale Packaged) LED chips.
Figure 1D:
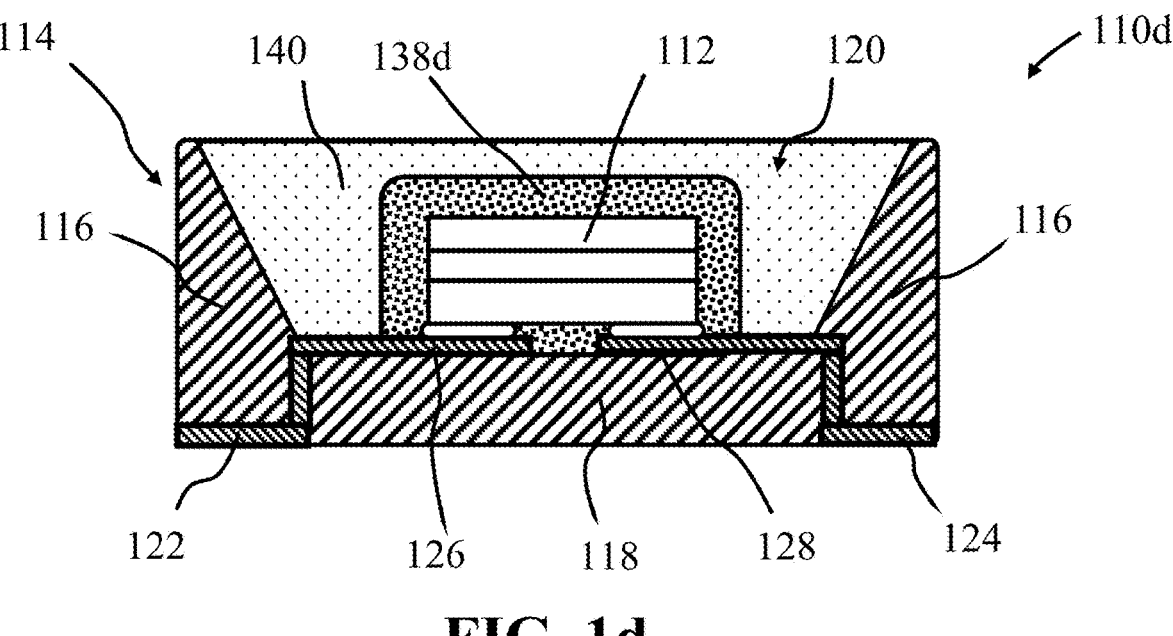

FIGS. 1c and 1d are schematic cross-sectional views of high luminous efficacy packaged white light emitting device that comprise a double-layer photoluminescence material structure utilizing CSP (Chip Scale Packaged) LED chips. In these embodiments, the first photoluminescence layer 138c, 138d comprises a substantially uniform thickness layer applied to at least the principle light emitting face of the LED chip(s) 112. As illustrated in FIG. 1c, the LED chip(s) 112 have a uniform thickness first photoluminescence layer 138c applied to their top (principle) light emitting face only. As illustrated in FIG. 1d, the LED chip(s) 112 have a uniform thickness first photoluminescence layer 138d applied to the top light emitting and four side light emitting faces and is in the form of a conformal coating. The light emitting devices of FIGS. 1c and 1d can be manufactured by first applying the first photoluminescence layer 138c, 138d to the light emitting face(s) of the LED chip(s) 112, for example using a uniform thickness (typically 50 μm to 400 μm) photoluminescence material film comprising the narrowband red phosphor material. The CSP LED chip(s) are then mounted on the floor of the cavity 120 and the second photoluminescence layer 140 is then deposited so as to fill the cavity 120 and cover the LED chip(s). Compared with the double-layer photoluminescence material structured white light emitting device of FIG. 1B, a uniform thickness coating layer is preferred as it concentrates all of the narrowband red phosphor material as close to the LED chip as possible and ensures that regardless of physical location within the layer all of the manganese-activated fluoride phosphor material receives exposure to substantially the same excitation light photon density. Such a uniform thickness layer can further increase QE of the device. Furthermore, test indicates that such an arrangement can reduce narrowband red phosphor material usage by up to 80% by weight compared with a single-layer photoluminescence structure.

High Luminous Efficacy COB Packaged White Light Emitting Devices

Figure 2A:
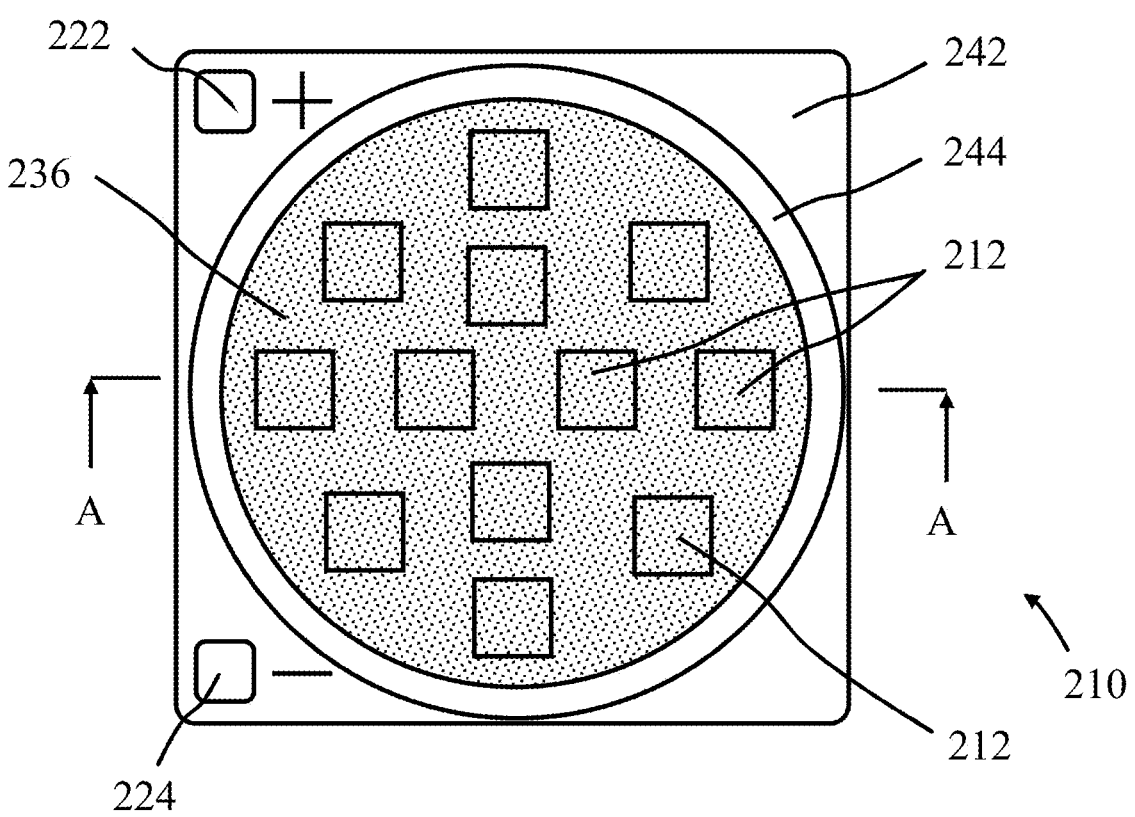
FIGS. 2a and 2b are schematic plan and cross-sectional side views of a high luminous efficacy COB (Chip On Board) white light emitting device, according to some embodiments, that comprises a single-layer photoluminescence material structure.
Figure 2B:
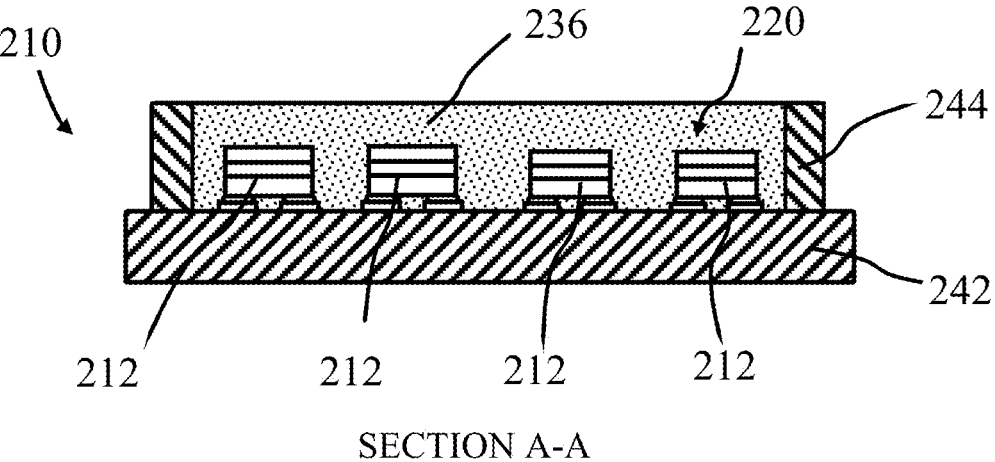

FIGS. 2a and 2b illustrate a high luminous efficacy Chip On Board (COB) packaged white light emitting device 210, according to some embodiments, in which FIG. 2a is a plan view and FIG. 2b is a sectional view through A-A. The device 210 has a Luminous Efficacy (LER) of at least 320 lm/W$_{opt}$ and is configured to generate white light with a CCT (Correlated Color Temperature) from 2200K to 6500K with a general CRI Ra of at least 80.

The device 210 comprises a plurality (twelve as illustrated) blue-emitting InGaN/GaN-based (indium gallium nitride/gallium nitride) LED chips (dies) 212, mounted in thermal communication on a substrate 242, such as an MCPCB (Metal Core Printed Circuit Board). The LED chips 212 generate blue excitation light of dominant wavelength from 420 nm to 480 nm, more typically 445 nm to 465 nm. As indicated in FIG. 2a, the LED chips 212 can be configured as a generally circular array. Electrical contacts 222, 224 can be provided on the top face of the substrate 242 for operating the white light emitting device 210. As shown, the photoluminescence materials comprise a single-layer photoluminescence material structure 236 that encapsulates the array of LED flip-chip dies 212. The single-layer photoluminescence material structure 236 can comprise a light transmissive optical encapsulant, such as for example a silicone or epoxy material, which is loaded with a mixture of broadband green to yellow, broadband orange to red, and narrowband red phosphor materials such that the exposed surfaces of the LED chips 420 are covered by the phosphor/silicone material mixture. As shown, the light transmissive encapsulant/phosphor material mixture 236 can be contained within an annular-shaped wall 244 which in conjunction with the substrate defines a cavity 220 in which the LED chips 212 are housed.

Figure 2C:
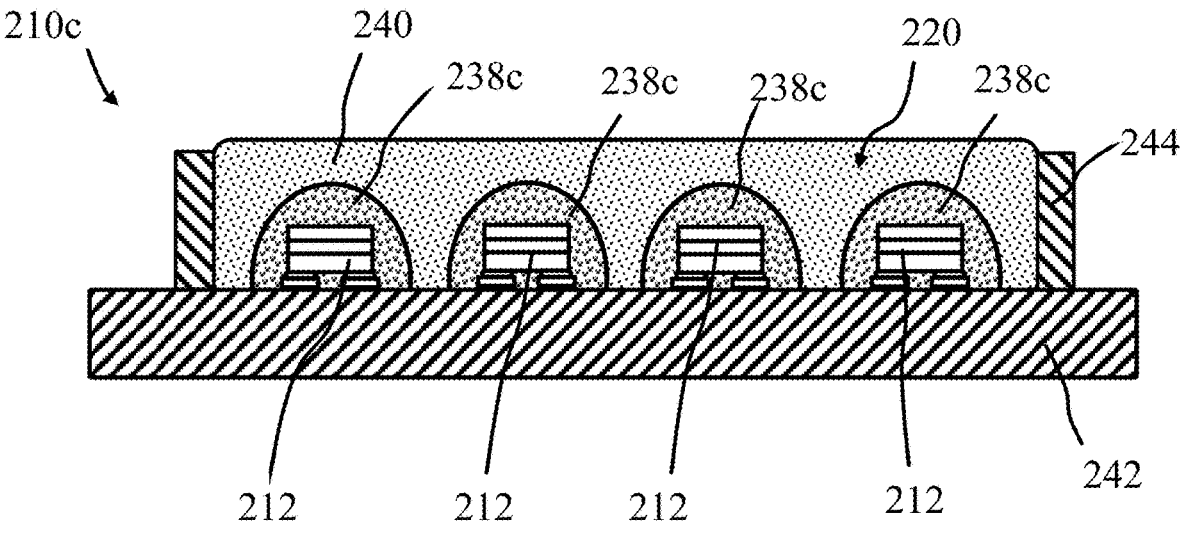
FIGS. 2c to 2e are schematic cross-sectional side view of a high luminous efficacy COB (Chip On Board) white light emitting device, according to some embodiments, that comprises a double-layer photoluminescence material structure.

FIG. 2c is a schematic cross-sectional side view of a high luminous efficacy COB (Chip On Board) white light emitting device 210c, according to some embodiments, that comprises a double-layer photoluminescence material structure. In this embodiment, each LED chip 212 has a respective first photoluminescence material layer 238c that encapsulates the LED chip 212 and in terms of photoluminescence material comprises only narrowband red phosphor. As illustrated, the first photoluminescence layers 238c can comprise a substantially conformal coating of uniform thickness. The second photoluminescence layer 240 encapsulates (covers) the first photoluminescence layers and comprises a mixture of broadband green to yellow and broadband orange to red phosphor materials. As illustrated, the first photoluminescence layer 238c can be generally hemispherical (dome-shaped) in form.

Figure 2D:
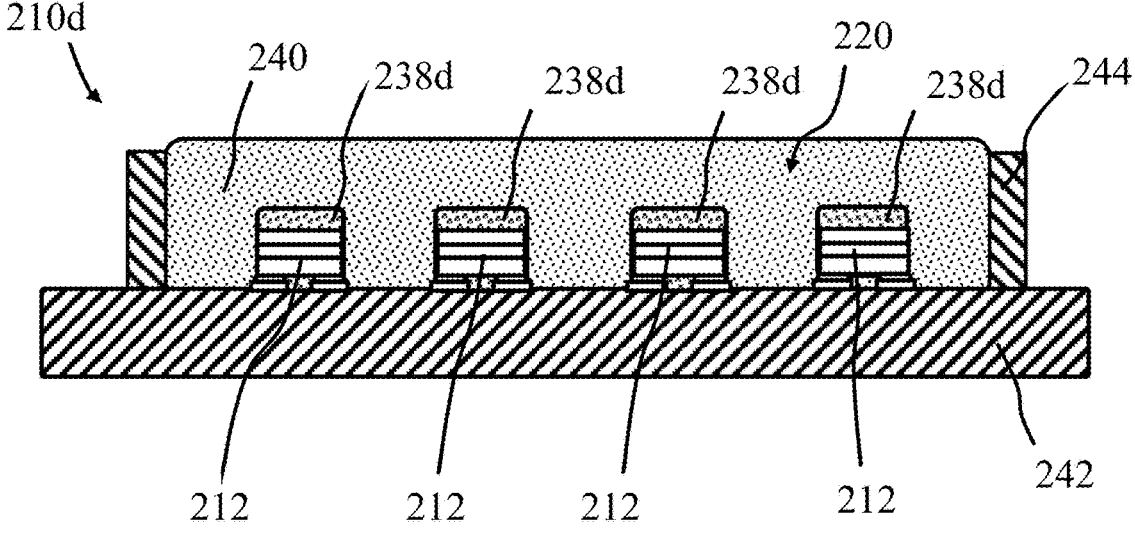
Figure 2E:
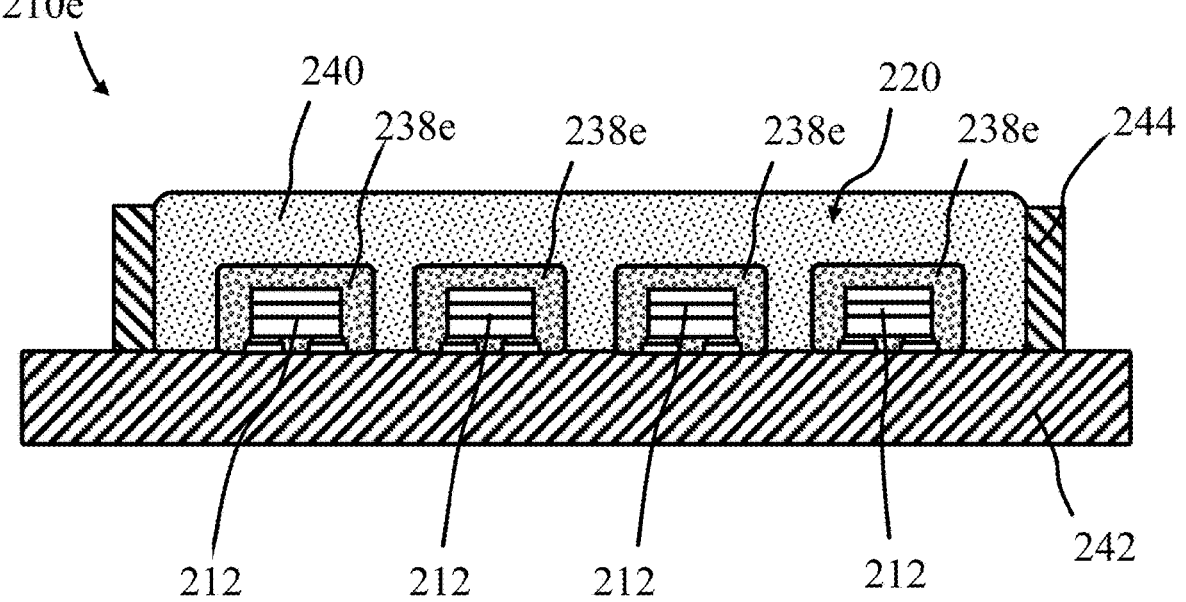
Figure 3C:
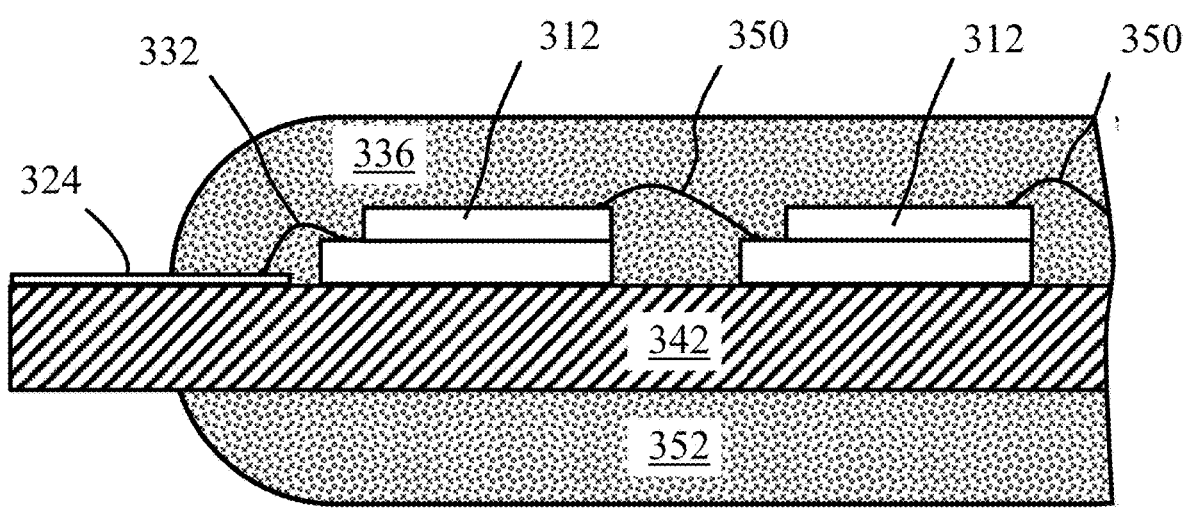
Figure 3D:
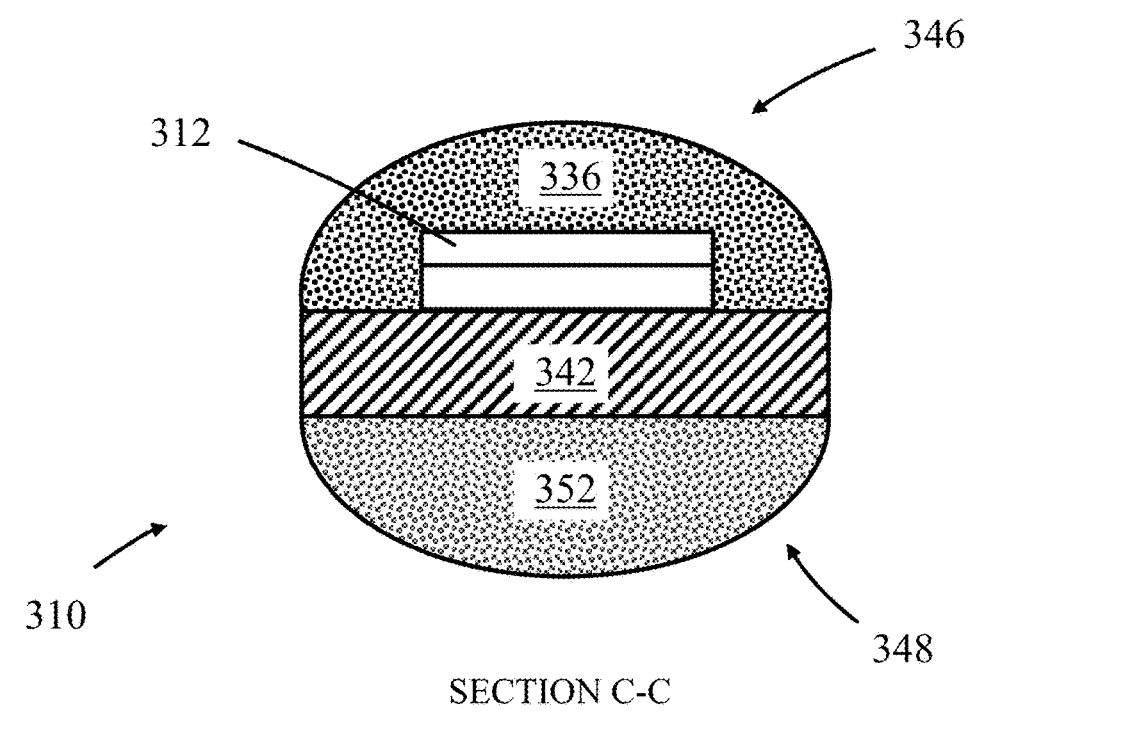
Figure 4C:
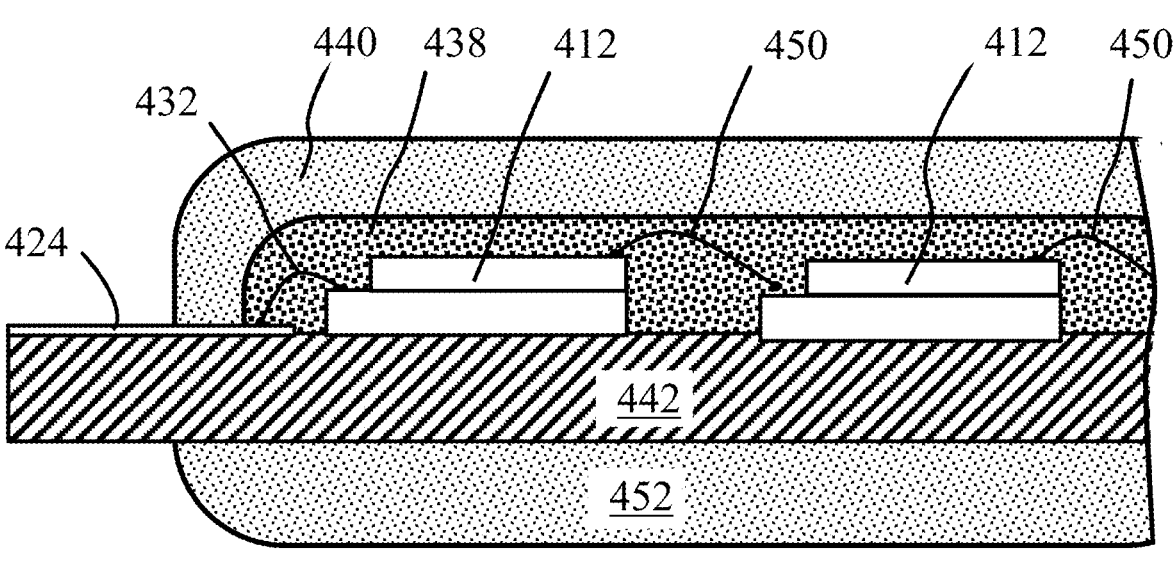
Figure 4D:
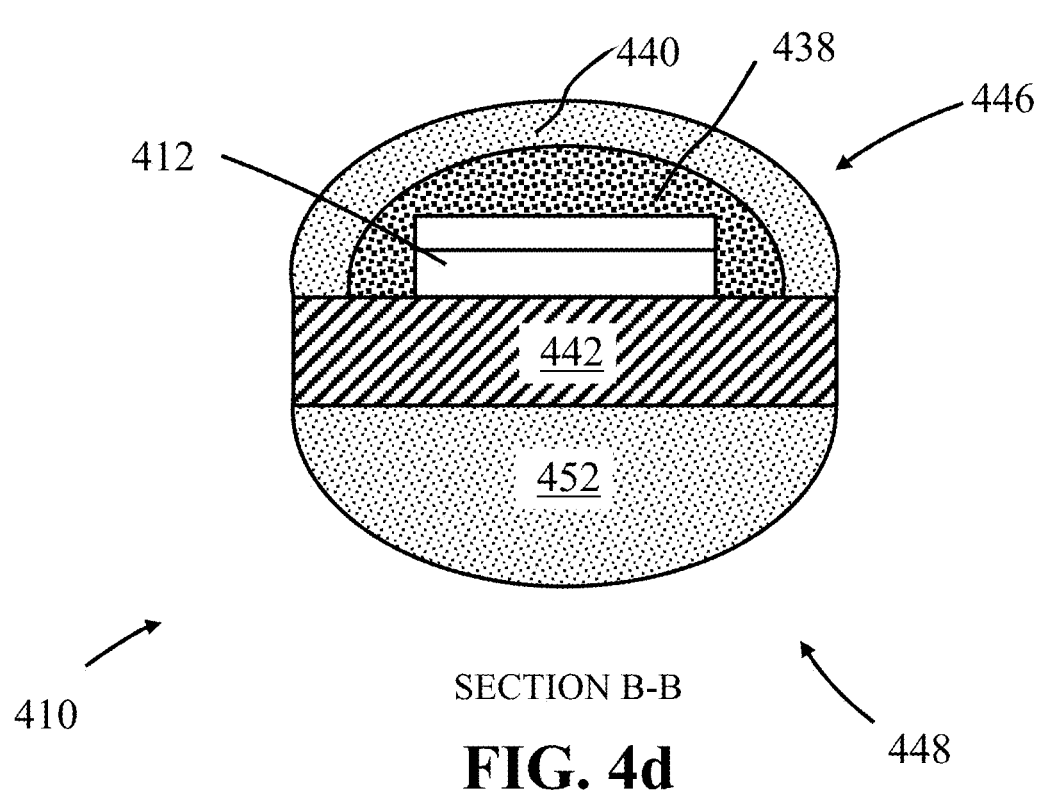

FIGS. 2d and 2e are schematic cross-sectional views of high luminous efficacy Chip On Board (COB) packaged white light emitting devices 210d, 210e that comprise a double-layer photoluminescence material structure and utilize CSP (Chip Scale Packaged) LED chips. In these embodiments, the first photoluminescence layer 238d, 238e comprises a substantially uniform thickness layer applied to at least the principle light emitting face of each LED chip 212. As illustrated in FIG. 2d, each LED chip 212 has a uniform thickness first photoluminescence layer 238d applied to its top (principle) light emitting face only. As illustrated in FIG. 2e, each LED chip 212 has a uniform thickness first photoluminescence layer 238e applied to the top light emitting and four side light emitting faces and is in the form of a conformal coating. The light emitting devices of FIGS. 2d and 2e can be manufactured by first applying the first photoluminescence layer 138c, 138d to the light emitting face(s) of each LED chip 212, for example using a uniform thickness (typically 20 μm to 300 μm) photoluminescence material film comprising the narrowband red phosphor material. The CSP LED chips are then mounted to the substrate 242 and the second photoluminescence layer 240 is then deposited so as to fill the cavity 220 and cover the CSP LED chips.

High Luminous Efficacy LED-Filaments
Single-Layer Structured LED-Filaments

A high luminous efficacy LED-filament 310, according to embodiments, comprising a single-layer photoluminescence material structure is now described with reference to FIGS. 3a, 3b, 3c, and 3d which respectively illustrate schematic cross-sectional B-B side, partial cutaway plan, enlarged cross-sectional B-B side and cross-sectional C-C end views of the LED-filament. The LED-filament (device) 310 has a Luminous Efficacy (LER) of at least 320 lm/W$_{opt}$ and is configured to generate white light with a CCT (Correlated Color Temperature) from 2200K to 6500K with a general CRI Ra of at least 80.

The LED-filament 310 comprises a partially light-transmissive substrate 342 having a linear array (plurality) of InGaN/GaN-based (dies) 312 mounted directly to a front (first) face 346. Typically, each LED-filament has a total nominal power of about 0.7 W to 1 W.

The substrate 342 can further comprise the respective electrical first and second contacts 322, 324 on the front face 346 at the first and second ends of the substrate 342 for providing electrical power to operate the LED-filament. The electrical contacts 322, 324 can comprise copper, silver or other metal or a transparent electrical conductor such as indium tin oxide (ITO). In the embodiment illustrated, the substrate 342 is planar and has an elongate form (strip) with the LED chips 312 being configured as a linear array (string) and equally spaced along the length (direction of elongation) of the substrate. As indicated in FIGS. 3a and 3b the LED chips 312 can be electrically connected in series by bond wires 350 between adjacent the LED chips of the string and bond wires 332, 334 between the LED chips at the distal ends of the substrate and their respective electrical contact 322, 324.

The light-transmissive substrate 342 can comprise any material which is at least partially light-transmissive and preferably has a transmittance to visible light from 2% to over 90% (reflectance of 98% to 10%). The substrate can comprise a glass, ceramic material, sapphire, or a plastics material such as polypropylene, silicone or an acrylic. In embodiments the light-transmissive substrate comprises a porous ceramic substrate composed of alumina that has a transmittance of about 40%. To aid in the dissipation of heat generated by the LED chips 312, the substrate 342 can not only be light-transmissive, but can also be thermally conductive to aid in the dissipation of heat generated by the LED chips. Examples of suitable light-transmissive thermally conductive materials include: magnesium oxide, sapphire, aluminum oxide, quartz glass, and diamond. The transmittance of the thermally conductive substrate can be increased by making the substrate thin. To increase mechanical strength, the substrate can comprise a laminated structure with the thermally conductive layer mounted on a light-transmissive support such as a glass or plastics material.

The LED-filament 310 further comprises a single-layer photoluminescence structure 336 constituted in the form of a single encapsulating layer that covers the LED chips 312 and front face 346 of the substrate 342. As with other embodiments, the single-layer photoluminescence structure 336 comprises a single-layer that can comprise a light transmissive optical encapsulant, such as for example a silicone or epoxy material, which is loaded with a mixture of the broadband green to yellow, broadband orange to red, and narrowband red photoluminescence materials. As shown, a second single-layer photoluminescence wavelength conversion material 352 can be applied to and cover the second back (opposite) face 348 of the substrate 342. The photoluminescence materials in the first and second single-layer photoluminescence structure 336, 352 can be the same to ensure a uniform color of light is emitted from the front and back faces of the LED-filament.

Double-Layer Structured LED-Filaments

A high luminous efficacy LED-filament 410, according to embodiments, that comprises a double-layer photoluminescence material structure is now described with reference to FIGS. 4a, 4b, 4c, and 4d which respectively illustrate schematic cross-sectional B-B side, partial cutaway plan, enlarged cross-sectional B-B side and cross-sectional C-C end views of the LED-filament. The LED-filament (device) 410 has a Luminous Efficacy (LER) of at least 320 lm/W$_{opt}$ and an Overall Luminous Efficacy (OLE) of at least 210 lm/W$_{dc}$ and is configured to generate white light with a CCT (Correlated Color Temperature) from 2200K to 6500K with a general CRI Ra of at least 80.

As illustrated in FIGS. 4a to 4d, the double-layer photoluminescence structure comprises a first photoluminescence layer 438, which in terms of photoluminescence materials contains only narrowband red phosphor material, is disposed on and covers (encapsulates) all of the LED chips 412 and a second photoluminescence layer 440, containing a mixture of broadband green to yellow and broadband orange to red phosphor materials is disposed on and covers (encapsulates) the first photoluminescence layer 438. As can be seen from FIG. 4c the first photoluminescence layer 438 is in the form of a continuous (unbroken) strip that covers all of the LED chips and the front face of the substrate between adjacent LED chips.

The double-layer LED-filament of FIGS. 4a to 4d can be manufactured by firstly depositing the first photoluminescence layer 438 onto the LED chips 412 in the form of a linear strip and then depositing the second photoluminescence layer 440 on the first photoluminescence layer 438. As illustrated the first photoluminescence layer 438 can have a cross section that is generally semi-circular in profile.

Broadband Green to Yellow Phosphor Materials

In this patent specification, a broadband green to yellow phosphor material refers to a photoluminescence material (phosphor) which, in response to stimulation by excitation light, generates light having a peak emission wavelength ($\lambda_{pe}$) from about 500 nm to about 570 nm (more typically from 530 nm to 550 nm), that is in the green to yellow region of the visible spectrum. Preferably the green to yellow phosphor has a broad emission characteristic with a FWHM (Full Width at Half Maximum) of ~100 nm or wider. The green to yellow phosphor can comprise garnet-based phosphor such as YAG or LuAG phosphors. Examples of suitable green to yellow phosphors are given in Table 1.

In embodiments, the green to yellow phosphor comprises a cerium-activated yttrium aluminum garnet phosphor of general composition $Y_3(Al,Ga)_5O_{12}$:Ce (YAG). In this patent specification, the notation YAG #represents the phosphor type—YAG—based phosphors—followed by the peak emission wavelength in nanometers (#). For example, YAG535 denotes a YAG phosphor with a peak emission wavelength of 535 nm. The green to yellow phosphor may comprise a green emitting cerium-activated yttrium aluminum garnet phosphor of general composition $(Y,Ba)_3(Al,Ga)_5O_{12}$:Ce (YAG) such as for example a GNYAG series phosphor from Intematix Corporation, Fremont California, USA. In some embodiments, the green to yellow phosphor can comprise a cerium-activated lutetium aluminum garnet (LuAG) of general composition $Lu_3Al_5O_{12}$:Ce (GAL). Examples of such phosphors include for example the GAL series of phosphor from Intematix Corporation, Fremont California, USA which have a peak emission wavelength of 516 nm to 560 nm and a FWHM of ~120 nm. In this patent specification, the notation GAL #represents the phosphor type (GAL)—LuAG—based phosphors—followed by the peak emission wavelength in nanometers (#). For example, GAL520 denotes a GAL phosphor with a peak emission wavelength of 520 nm.

$CaAlSiN_3$:$Eu^{2+}$. The CASN phosphor can be doped with other elements such as strontium (Sr) and have a general formula $(Sr,Ca)AlSiN_3$:$Eu^{2+}$. In this patent specification, the notation CASN #represents the phosphor type (CASN) followed by the peak emission wavelength ($\lambda_{pe}$) in nanometers (#). For example CASN615 denotes an orange to red CASN phosphor with a peak emission wavelength of 615 nm.

In some embodiments, broadband orange to red phosphor can comprise a europium-activated nitride-based phosphor of general composition $Ba_{2-x}Sr_xSi_5N_8$:Eu.

In some embodiments, the orange to red phosphor can comprise an orange-emitting silicate-based phosphor as taught in U.S. Pat. No. 7,655,156 entitled "Silicate-Based Orange Phosphors". Such an orange-emitting silicate-based phosphor can have a general composition $(Sr_{1-x}M_x)_yEu_zSiO_5$ where $0<x\leq0.5$, $2.6\leq y\leq3.3$, $0.001\leq z\leq0.5$ and M is one or more divalent metal selected from the group consisting of Ba, Mg, Ca, and Zn. In this patent specification, the notation O #represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 2

| | Example broadband orange to red phosphors | | |
|---|---|---|---|
| Phosphor | General Composition | | Wavelength $\lambda_{pe}$ (nm) |
| CASN | $(Ca_{1-x}Sr_x)AlSiN_3$:Eu | $0.5 < x \leq 1$ | 600-660 |
| (CASN#) | $Ba_{2-x}Sr_xSi_5N_8$:Eu | $0 \leq x \leq 2$ | 580-630 |
| 258 nitride | $(Sr_{1-x}M_x)_yEu_zSiO_5$ | M = Ba, Mg, Ca, Zn | 565-610 |
| Silicate | | $0 < x \leq 0.5$ | |
| (O#) | | $2.6 \leq y \leq 3.3$ | |
| | | $0.001 \leq z \leq 0.5$ | |

TABLE 1

| | Example broadband green to yellow phosphors | | |
|---|---|---|---|
| Phosphor | General Composition | | Wavelength $\lambda_{pe}$ (nm) |
| YAG (YAG#) | $Y_{3-x}(Al_{1-y}Ga_y)_5O_{12}$:$Ce_x$ | $0.01 < x < 0.2$ & $0 < y < 2.5$ | 520-570 |
| GNYAG (YAG#) | $(Y,Ba)_{3-x}(Al_{1-y}Ga_y)_5O_{12}$:$Ce_x$ | $0.01 < x < 0.2$ & $0 < y < 2.5$ | 520-550 |
| LuAG (GAL#) | $Lu_{3-x}(Al_{1-y}M_y)_5O_{12}$:$Ce_x$ | $0.01 < x < 0.2$ & $0 < y < 1.5$ M = Mg, Ca, Sr, Ba, Ga, | 500-550 |
| LuAG (GAL#) | $Lu_{3-x}(Al_{1-y}Ga_y)_5O_{12}$:$Ce_x$ | $0.01 < x < 0.2$ & $0 < y < 1.5$ | 500-550 |

Broadband Orange to Red Phosphor Materials

In this patent specification, a broadband orange to red phosphor refers to a photoluminescence material which, in response to stimulation by excitation light, generates light having a peak emission wavelength from 600 nm to 670 nm; that is light in the orange to red region of the visible spectrum and which has a broad emission characteristic with a full width at half maximum (FWHM) emission intensity of at least 50 nm. The broadband orange to red phosphor material can include for example a europium activated silicon nitride-based phosphor, or silicate-based phosphors. Examples of broadband orange to red phosphors are given in Table 2.

In some embodiments, the europium-activated silicon nitride-based phosphor comprises a Calcium Aluminum Silicon Nitride phosphor (CASN) of general formula Narrowband Red Phosphor Materials In this patent specification, a narrowband red phosphor material refers to a photoluminescence material which, in response to stimulation by excitation light, generates light having a peak emission wavelength from 628 nm to 640 nm; that is light in the red region of the visible spectrum and which has a narrow emission characteristic with a full width at half maximum (FWHM) emission intensity from about 5 nm to about 30 nm. As described above, the narrowband red photoluminescence can comprise a manganese-activated fluoride red phosphor. An example of a narrowband red manganese-activated fluoride phosphor is manganese-activated potassium hexafluorosilicate phosphor (KSF)—$K_2SiF_6$:$Mn^{4+}$ (KSF). An example of such a KSF phosphor is NR6931 KSF phosphor from Intematix Corporation, Fremont California, USA which has a peak emission wavelength of about 632 nm. Other manganese-activated phosphors can include: $K_2GeF_6:Mn^{4+}$ (KGF), $K_2TiF_6:Mn^{4+}$ (KTF), $K_2SnF_6:Mn^{4+}$, $Na_2TiF_6:Mn^{4+}$, $Na_2ZrF_6:Mn^{4+}$, $Cs_2SiF_6:Mn^{4+}$, $Cs_2TiF_6:Mn^{4+}$, $Rb_2SiF_6:Mn^{4+}$, and $Rb_2TiF_6:$ $Mn^{4+}$.

Cavity Test Method

The cavity test method involves mixing the phosphor powder mixture with an uncurable optical encapsulant (typically a phenyl silicone) and placing the mixture in a LED package cavity containing one or more blue LED dies and measuring total light emission in an integrating sphere. Once the measurement is completed the phosphor/encapsulant mixture is removed and the cavity cleaned ready for the next test. The cavity comprises a 5630 (5.6 mm×3.0 mm) SMD package containing a single 1133 (11 mil by 33 mil—chip area 0.56 mm$^2$) LED chip of dominant wavelength $\lambda_d$=453 nm.

In this specification, the following nomenclature is used for white light emitting devices: Com. #denotes a comparative white light emitting device that generates light with a target chromaticity (color point) corresponding to the center point of the ANSI standard chromaticity on the CIE 1931 x, y chromaticity diagram and Dev. #denotes a high efficacy white light emitting device in accordance with an embodiment of the invention that generates light with a chromaticity (color point) with a CIE y value greater than the Planckian locus of black body radiation (black body locus) and greater than the ANSI center point. Table 3 tabulates ANSI (American National Standard Institute) Standard Chromaticity center point values for solid state lighting for different color temperatures. The ANSI standard center color points are on, or just above, the black body locus. The values in Table 3 are from ANSI_NEMA_ANSLG C78.377-2008: American National Standard for electric lamps—Specifications for the Chromaticity of Solid State Lighting Products.

TABLE 3

ANSI CIE 1931 x, y Chromaticity Center point values

| CCT (K) | x | y |
|---|---|---|
| 2700 | 0.4578 | 0.4101 |
| 3000 | 0.4338 | 0.4030 |
| 3500 | 0.4073 | 0.3917 |
| 4000 | 0.3818 | 0.3797 |
| 4500 | 0.3611 | 0.3658 |
| 5000 | 0.3447 | 0.3553 |
| 5700 | 0.3287 | 0.3417 |
| 6500 | 0.3123 | 0.3282 |

Experimental Data—2700K to 6500K Packaged White Light Emitting Devices

Table 4 tabulates phosphor compositions for high luminous efficacy white light emitting devices according to the invention, designated Dev.1 to Dev.3 and comparative white light emitting devices Com.1 to Com.3. The devices are configured to respectively generate white light with a nominal CCT (Correlated Color Temperature) of 2700K, 4000K and 6500K respectively and a General CRI Ra of about 80 or greater. For the comparative white light emitting devices (Com.1 to Com.3), the phosphor composition is selected so that the device generates white light with a CIE 1931 chromaticity (color point) CIE x, y corresponding to the ANSI center point. For white light emitting devices (Dev.1 to Dev.3) in accordance with the invention the phosphor composition, is selected so that the device generates white light with a CIE 1931 chromaticity (color point) CIE x, y with a CIE y value greater than the Planckian locus of black body radiation (black body locus) and greater than the ANSI center point value. More particularly devices in accordance with the invention are configured to generate white light with a CIE 1931 Duv that is from 0.0060 to 0.0170.

As can be seen from Table 4, in terms of phosphor composition: Com.1 comprises a ratio of green phosphor (YAG543) to red phosphor (CASN615+KSF) of 0.82:1.00; Dev.1 comprises ratio of green phosphor (YAG543) to red phosphor (CASN615+KSF) of 1.27:1.00; Com.2 comprises a ratio of green phosphor (YAG543) to red phosphor (CASN615+KSF) of 1.78:1.00; Dev.2 comprises a ratio of green phosphor (YAG543) to red phosphor (CASN615+KSF) of 2.33:1.00; Com.3 comprises a ratio of green phosphor (YAG538) to red phosphor (CASN615+KSF) of 2.85:1.00; and Dev.3 comprises a ratio of green phosphor (YAG538) to red phosphor (CASN615+KSF) of 4.00:1.00.

TABLE 4

Phosphor composition of single-layer structured white light emitting devices Com. 1, Dev. 1 (2700 K), Com. 2, Dev. 2 (4000 K), and Com. 3, Dev. 3 (6500 K)

| | Ratio of green to red phosphor | |
|---|---|---|
| Device | | % Increase |
| Com. 1 | 0.82:1 | — |
| Dev. 1 | 1.27:1 | 55 |
| Com. 2 | 1.78:1 | — |
| Dev. 2 | 2.33:1 | 31 |
| Com. 3 | 2.85:1 | — |
| Dev. 3 | 4.00:1 | 40 |

Tables 5 and 6 tabulate measured phosphor PCT2835 cavity test data for the white light emitting devices Com.1, Dev.1, Com.2, Dev.2, Com.3, and Dev.3 and illustrate how luminous efficacy (LER) can be increased by the choice of phosphor composition. The data are for (drive) conditions $I_F$=120 mA (Current density 215 mA/mm$^2$), $V_F$∞3.1V (370 mW).

As can be seen from the Tables 5 and 6 comparative device Com.1 generates white light with a CCT ∞2700K, a General CRI Ra of about 80 and has a Luminous Efficacy (LER) of 349 lm/W$_{opt}$ while device Dev.1 generates white light with a CCT ∞2700K, a General CRI Ra of about 80 and has a Luminous Efficacy (LER) of 368 lm/W$_{opt}$. As will be explained further, the 5% increase in LER is attributable to the choice of phosphor composition; more particularly an increased proportion of broadband green to yellow phosphor to total orange to red phosphor. Comparative device Com.2 generates white light with a CCT ∞4000K, a General CRI Ra of about 80 and has a Luminous Efficacy (LER) of 344 lm/W$_{opt}$ while device Dev.2 generates white light with a CCT∞4000K, a General CRI Ra of about 80 and has a Luminous Efficacy (LER) of 367 lm/W$_{opt}$. This 7% increase in LER is again attributable to the choice of phosphor composition. Comparative device Com.3 generates white light with a CCT∞6500K, a General CRI Ra of about 80 and has a Luminous Efficacy (LER) of 316 lm/W$_{opt}$ while device Dev.3 generates white light with a CCT∞6500K, a General CRI Ra of 80 and has a Luminous Efficacy (LER) of 333 lm/W$_{opt}$. Again this 7% increase in LER is again attributable to the choice of phosphor composition. As can be seen from Table 4, in terms of phosphor composition, the difference between the comparative white light emitting device Com. #and the white light emitting device of the invention Dev. #is an increase in the relative proportion of green phosphor to total red phosphor (broadband+narrowband). Furthermore, it can be seen (Table 5) that phosphor composition increases the Conversion Efficiency (CE) of the device by increasing LER and has little or no effect on Quantum Efficiency (QE), Stokes Efficiency (SE), or Wall Plug Efficiency (WPE).

Figure 5:
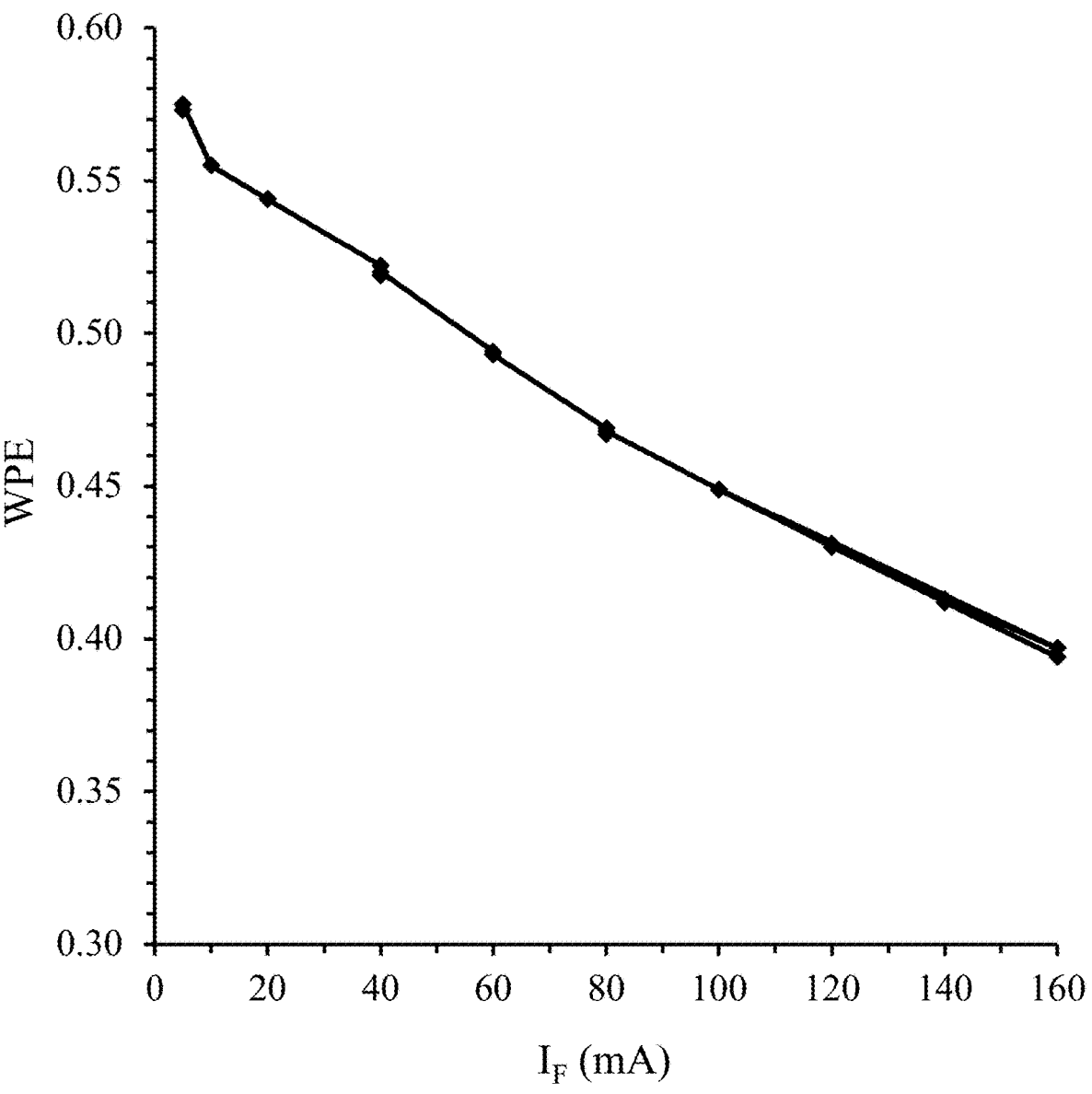
FIG. 5 is a plot of WPE (Wall Plug Efficiency) versus forward drive current $I_F$ (mA) for an SMD 5630 package.

It is to be noted that while the cavity test is a convenient way of quickly testing different phosphor compositions without fabricating devices, it has low WPE of 0.45 resulting in the stated Overall Luminous Efficacy (OLE) of only 118 to 127 lm/W$_{dc}$. Preliminary testing indicate that in an actual packaged light emitting device, WPE can be increased to 0.6 to 0.7 by using higher power LED dies and/or a greater number of LED dies and by under-driving the LED die(s) and the choice of package arrangement indicating that packaged white LEDs with an OLE of 210 lm/W$_{dc}$ and greater are achievable. FIG. 5 is a plot of WPE (Wall Plug Efficiency) versus forward drive current I$_F$ (mA) for an SMD 5630 package containing a single 2640 (26 mil by 40 mil—chip area 1.6 mm$^2$) LED die and illustrates how WPE can be increased by under-driving the LED chip in terms of current density. As can be seen from the figure, operating the LED chip at a forward current of 160 mA (current density 100 mA/mm$^2$) the package has a WPE of about 0.4. By under-driving the LED chip at a forward current of 10 mA (current density 6.3 mA/mm$^2$), WPE increases to 0.57.

TABLE 5

Measured characteristics of single-layer
structured white light emitting devices Com. 1, Dev. 1
(2700K), Com. 2, Dev. 2 (4000K), and Com. 3, Dev. 3 (6500K)

| Device | Flux (lm) | LER (lm/ W$_{opt}$) | LER % (Dev. #/ Com. #) | CE | QE | SE | WPE | OLE (lm/ W$_{dc}$) |
|---|---|---|---|---|---|---|---|---|
| Com. 1 | 43.2 | 349 | 100 | 259 | 0.96 | 0.77 | 0.45 | 116 |
| Dev. 1 | 44.3 | 368 | 105 | 265 | 0.94 | 0.77 | 0.45 | 118 |
| Com. 2 | 46.4 | 344 | 100 | 278 | 1.00 | 0.81 | 0.45 | 124 |
| Dev. 2 | 48.2 | 367 | 107 | 288 | 0.99 | 0.79 | 0.44 | 128 |
| Com. 3 | 45.6 | 316 | 100 | 268 | 1.02 | 0.84 | 0.46 | 122 |
| Dev. 3 | 47.6 | 333 | 105 | 280 | 1.00 | 0.84 | 0.45 | 127 |

TABLE 6

Measured characteristics of single-layer
structured white light emitting devices Com. 1,
Dev. 1 (2700K), Com. 2, Dev. 2 (4000K), and Com. 3, Dev. 3 (6500K)

| Device | CCT (K) | CIE Chromaticity 1931 x | y | 1976 Duv | CRI Ra | R9 |
|---|---|---|---|---|---|---|
| Com. 1 | 2729 | 0.4575 | 0.4099 | 0.0001 | 79.9 | 5.6 |
| Dev. 1 | 2705 | 0.4471 | 0.4421 | 0.0097 | 79.5 | 6.7 |
| Com. 2 | 3987 | 0.3815 | 0.3788 | 0.0007 | 80.4 | 12.8 |
| Dev. 2 | 3735 | 0.4053 | 0.4225 | 0.0134 | 80.8 | 19.8 |
| Com. 3 | 6545 | 0.3121 | 0.3285 | 0.0033 | 80.2 | 4.4 |
| Dev. 3 | 6569 | 0.3082 | 0.3515 | 0.0164 | 76.1 | −17 |

Figure 6:
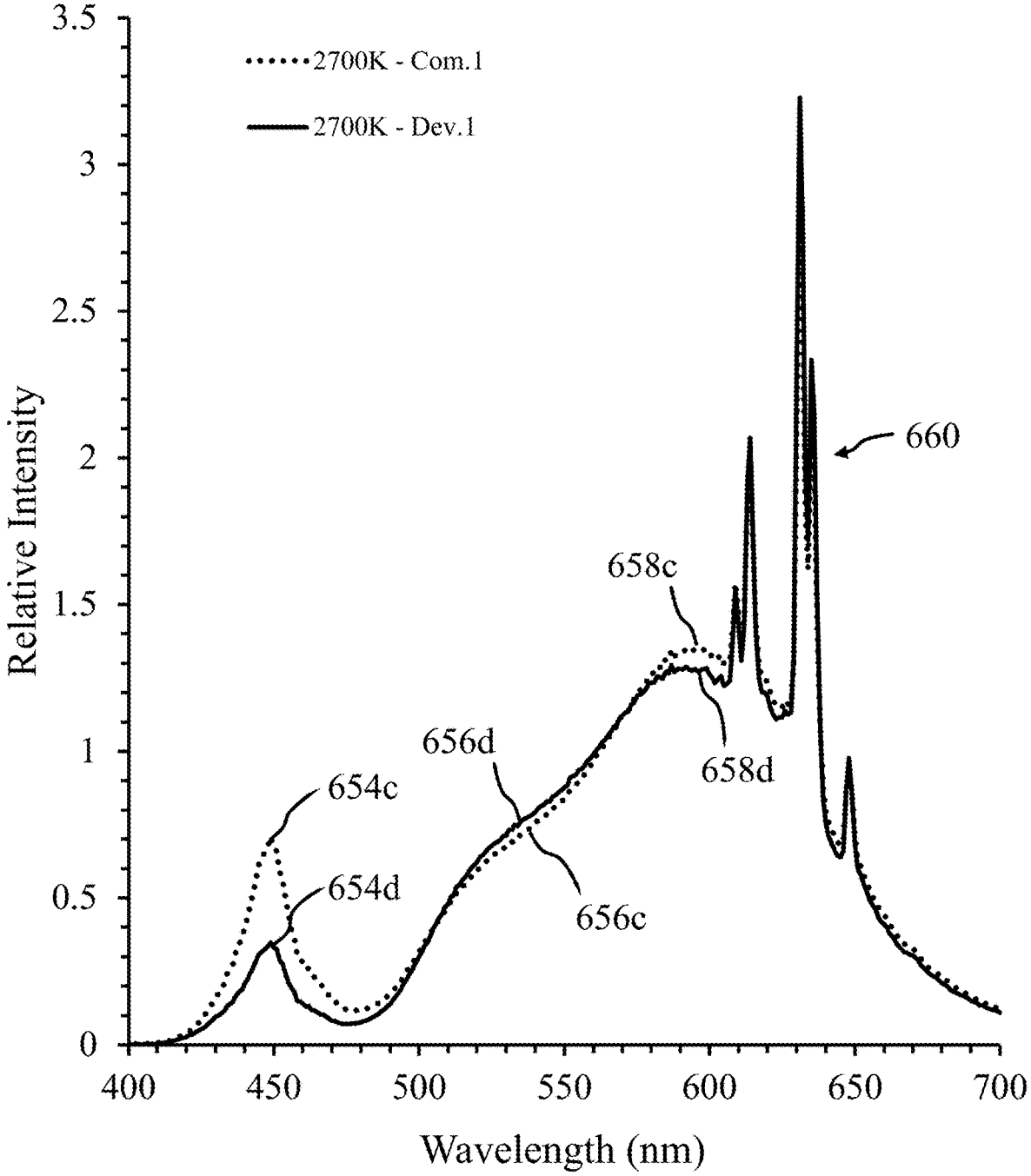
FIG. 6 are emission spectra, relative intensity versus wavelength (nm), for 2700K white light emitting devices (i) Dev.1 (thick solid line), and (ii) Com.1 (dotted line)
Figure 7:
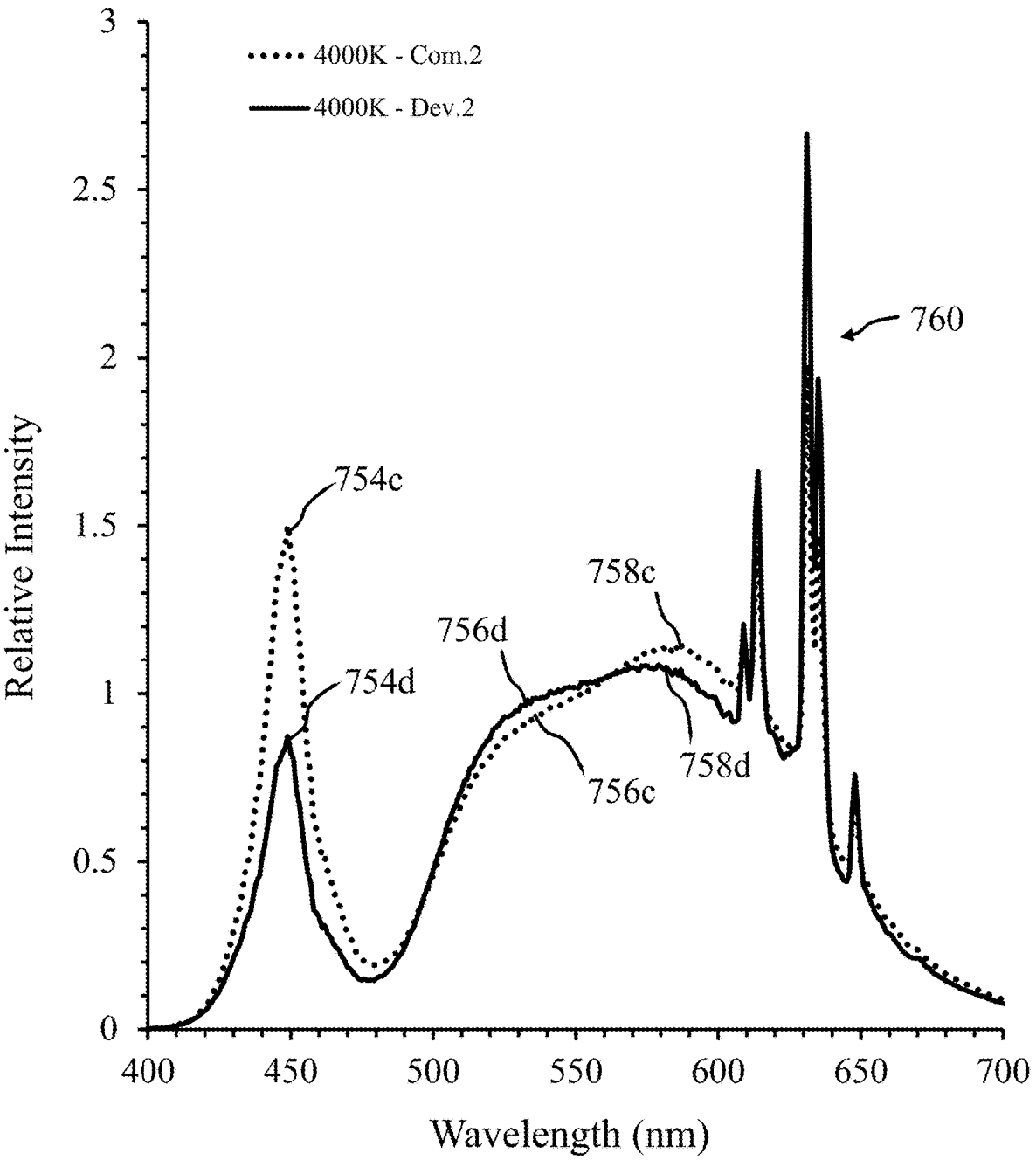
FIG. 7 are emission spectra, relative intensity versus wavelength (nm), for 4000K white light emitting devices (i) Dev.2 (thick solid line), and (ii) Com.2 (dotted line)

The effect of the change in phosphor composition on the emission spectrum is now explained with reference to FIGS. 6 to 8 in which FIG. 6 are emission spectra, relative intensity versus wavelength (nm), for Dev.1 (2700K—thick solid line) and Com.1 (2700K—dotted line); FIG. 7 are emission spectra, relative intensity versus wavelength (nm), for Dev.2 (2700K—thick solid line) and Com.1 (2700K—dotted line); and FIG. 8 are emission spectra, relative intensity versus wavelength (nm), for Dev.3 (6500K—thick solid line) and Com.1 (6500K—dotted line).

As can be seen from FIG. 6, white light generated by Com.1 (dotted line) has a spectrum comprising four spectral features: (i) a peak 654$c$ at about 450 nm in the blue region of the spectrum attributable to excitation light generated by the blue LED; (ii) a diffuse peak (point of inflection) 656$c$ at about 540 nm in the green region of the spectrum attributable to light generated by the broadband green to yellow phosphor; (iii) a diffuse peak 658$c$ at about 600 nm in the red region of the spectrum attributable to light generated by the broadband orange to red phosphor; and (iv) multiple narrow peaks 660 from about 620 nm to about 650 nm in the red region of the spectrum attributable to light generated by the narrowband red phosphor (KSF). Similarly, as can be seen from FIG. 6, white light generated by Dev.1 (solid line) comprises four spectral features: (i) a peak 654$d$ at about 450 nm in the blue region of the spectrum attributable to excitation light generated by the blue LED; (ii) a diffuse peak (point of inflection) 656$d$ at about 540 nm in the green region of the spectrum attributable to light generated by the broadband green to yellow phosphor; (iii) a diffuse peak 658$d$ at about 600 nm in the red region of the spectrum attributable to light generated by the broadband orange to red phosphor; and (iv) multiple narrow peaks 660 from about 620 nm to about 650 nm in the red region of the spectrum attributable to light generated by the narrowband red phosphor (KSF). Comparing the spectral features of the light emitting device of the invention Dev.1 with comparative device Com.1, it is to be noted that: the intensity of the blue peak 654 is substantially lower (about 50%), the intensity of the diffuse green peak 656 is higher, and the intensity of the red peak 658 is lower. The decrease in intensity of the blue peak 654 is attributable to more blue excitation light being converted to photoluminescence light, by for example, increasing the total amount of phosphor. The increase in intensity of green light 656 and corresponding decrease in red light 656 is a result of increasing the ratio of green phosphor to red phosphor. As can be seen from Table 4 the ratio of green phosphor to red phosphor in Com.1 is 45:55 (0.88:1) while the ratio of green phosphor to red phosphor of device Dev.1 is 56:44 (1.27:1) that is a 55% increase in the ratio of green phosphor to red phosphor.

Figure 8:
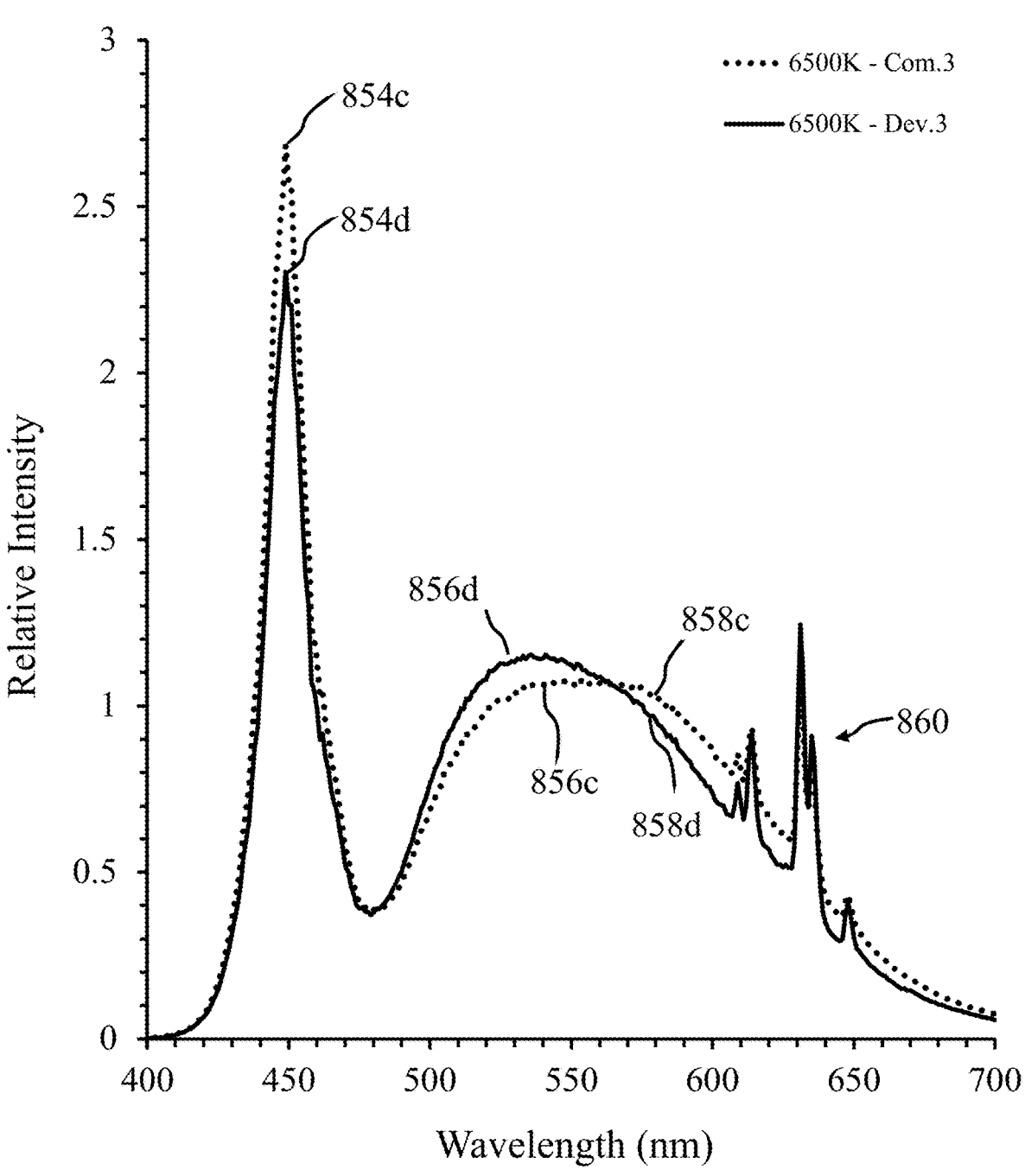
FIG. 8 are emission spectra, relative intensity versus wavelength (nm), for 6500K white light emitting devices (i) Dev.3 (thick solid line), and (ii) Com.3 (dotted line)

As will be apparent from FIGS. 7 and 8, light emitting devices Dev.2 and Dev.3 generate white light with similar spectral characteristics, which compared with their respective comparative device show: a decrease in blue peak intensity attributable to more blue excitation light being converted to photoluminescence light and an increase in intensity of green light and corresponding decrease in red light attributable to an increased ratio of green phosphor to red phosphor. As can be seen from Table 4, the ratio of green phosphor to red phosphor in Com.2 is 63:36 (1.78:1) while the ratio of green phosphor to red phosphor of device Dev.2 is 70:30 (1.27:1) that is a 30% increase in the ratio of green phosphor to red phosphor. For Com.3 the ratio of green phosphor to red phosphor is 74:26 (2.85:1) while the ratio of green phosphor to red phosphor of device Dev.3 is 80:20 (4.00:1) that is a 40% increase in the ratio of green phosphor to red phosphor.

Figure 9:
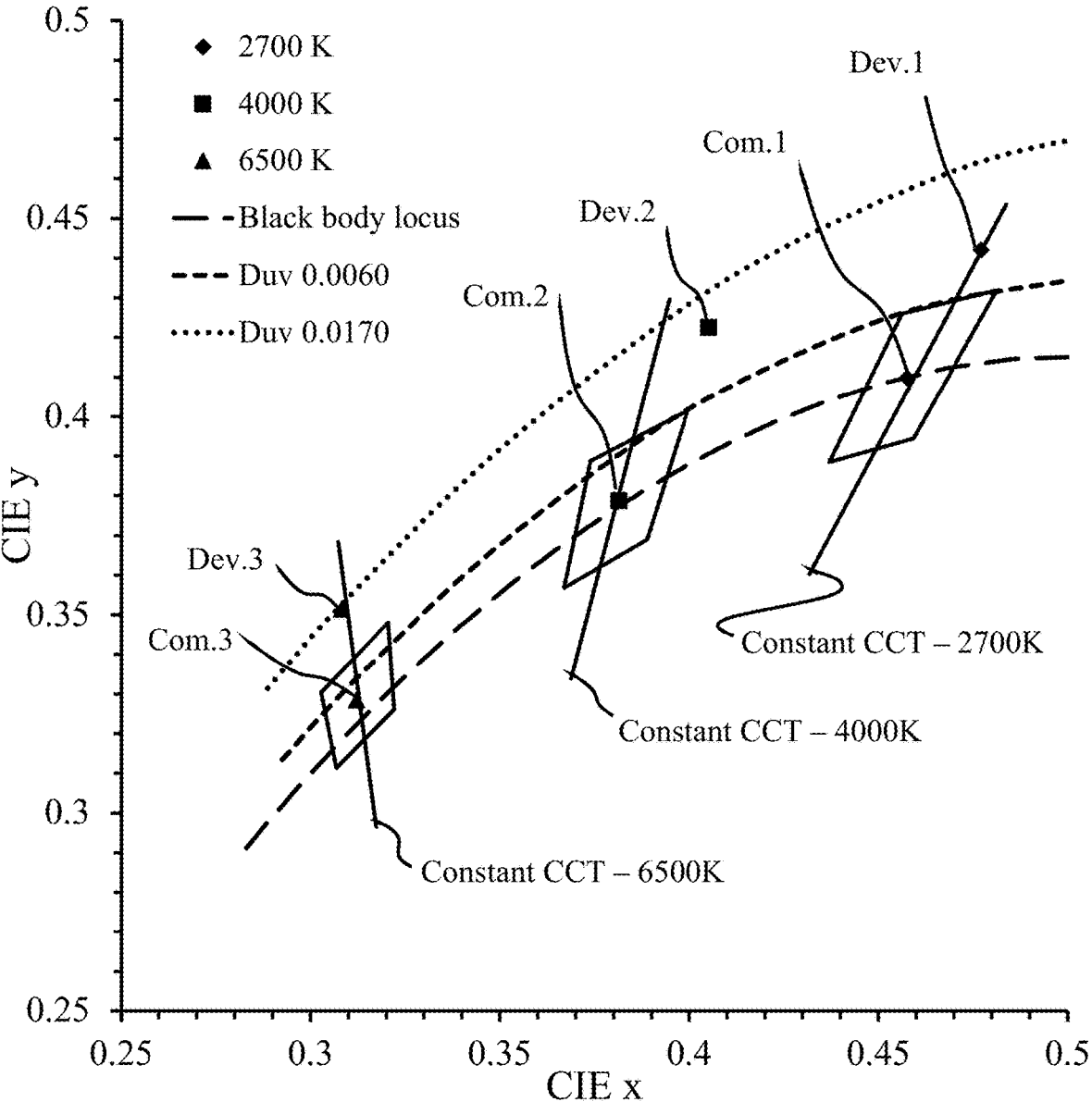
FIG. 9 is a CIE 1931 x, y chromaticity diagram showing the color point of light generated by: (i) Dev.1 and Com.1 (diamond symbol), (ii) Dev.2 and Com.2 (square symbol), and (iii) Dev.3 and Com.3 (triangle symbol).

FIG. 9 is a CIE 1931 chromaticity diagram CIE x, y showing the chromaticity (color point) of white light generated by: (i) Dev.1 and Com.1 (diamond symbol), (ii) Dev.2 and Com.2 (square symbol), and (iii) Dev.3 and Com.3 (triangle symbol). The chromaticity diagram also includes the Plankian locus of black body radiation, black body locus (long dashed line), iso-CCT lines (Lines of Constant CCT—solid line), ANSI 7 step quadrilaterals and CIE 1931 Duv locus for Duv=0.0060 (dashed line) and Duv=0.0170 (dotted line). The chromaticity diagram visually illustrates the chromaticity of light generated by comparative devices Com. #and white light emitting devices of the invention Dev.#.

As described herein, each of comparative devices Com.1 to Com.3 generate white light with a chromaticity (color point) that corresponds to that of the ANSI standard which is on or just above the black body locus. In contrast as indicated in FIG. 9 high efficacy white light emitting devices of the invention, Dev.1 to Dev.3, generate white light with a chromaticity (color point) that is on the iso-CCT (Constant color temperature) line at a point above the black body locus and above the ANSI standard center point.

As described herein, "Duv" (Delta u, v) is the Euclidean difference of chromaticity coordinate uv between a test light source to the closest point on the black body locus and is defined in ANSI_NEMA_ANSLG C78.377-2008. Duv is a measure on the 1976 CIE u, v chromaticity diagram of the distance of the color point of light of a given CCT (Correlated Color Temperature) from the Planckian locus of black body radiation (black body locus or curve) along the iso-CCT line (Lines of Constant Color Temperature). A positive Duv value indicates that the color point is above the black body locus and on a 1931 CIE x, y chromaticity diagram CIE y is greater than the CIE y value of the black body locus indicating a yellowish/greenish color shift from the black body locus. A negative value the color point is below the black body locus and on a 1931 CIE x, y chromaticity diagram CIE y is less than the CIE y value of the black body locus indicating that it has a pinkish color shift from the black body locus.

As can be seen from Table 5, Duv for comparative devices Com.1 to Com.3 are respectively 0.0001, 0.0007, and 0.0033 that is 0.1, 0.7, and 3.3 steps. In contrast, high efficacy white light emitting devices of the invention Dev.1 to Dev.3 generate white light with a respective Duv of 0.0097, 0.0134, and 0.0164 that is 9.7, 13.4, and 16.4 steps. It is to be noted that for each of devices Dev.1 to Dev.3 the color point of light generated by the device has a higher CIE y value compared with the corresponding comparative device consistent with an increased intensity of green light compared with red light (Table 5). As described herein, the increase in the intensity of green light compared with red light is due to the increased proportion (wt %) of green phosphor to total red phosphor (Table 4). It is believed that configuring the device to generate light with a positive Duv value (i.e. CIE y value higher than the black body locus) this leads to an increase LER and OLE.

Experimental Data—LED Filaments

Single-Layer Structured LED-Filaments

Single-layer structured high efficacy LED-filaments in accordance with the invention (Dev.4 to Dev.7) each comprise a 58 mm by 1.0 mm sapphire substrate with a transmittance of >90% having thirty eight serially connected 1128 (11 mil×28 mil—chip area 0.47 mm$^2$) blue LED chips of dominant wavelength $\lambda_d$=454 nm mounted on a front face. The LED-filaments are nominal 0.6 W devices and are intended to generate white light with a target CCT of 2700K (Dev.4), 3000K (Dev.5), 4000K (Dev.6), and 6500K (Dev.7) and a general color rendering index CRI Ra of about 80.

The narrowband red (KSF), broadband red (CASN615) and broadband green (YAG543) phosphors were mixed in a silicone encapsulant material and the mixture dispensed onto the front and back faces of the substrate (see FIGS. 3a to 3d).

Tables 7 and 8 tabulate measured characteristics of single-layer structured LED-filaments, Dev.4 to Dev.7. Data measurements are given for: (i) "power on" (Instant) and (ii) after reaching thermal equilibrium (Thermal) after approximately 2 to 3 minutes. All data are for (drive) conditions $I_F$∞6 mA (Current density 30 mA/mm$^2$), $V_F$∞100V (600 mW).

As can be seen from the Tables 7 and 8 LED-filament Dev.4 generates white light with a CCT of about 2700K (2685K), a General CRI Ra of 80 and, after reaching thermal equilibrium, a Luminous Efficacy (LER) of 366 lm/W$_{opt}$ and an overall luminous Efficacy (OLE) of 214 lm/W$_{dc}$. LED-filament Dev.5 generates white light with a CCT of about 3000K (2835K), a General CRI Ra of 80 and, after reaching thermal equilibrium, a Luminous Efficacy (LER) of 364 lm/W$_{opt}$ and an overall luminous Efficacy (OLE) of 223.8 lm/W$_{dc}$. LED-filament Dev.6 generates white light with a CCT of about 4000K (3939K), a General CRI Ra of 80 and, after reaching thermal equilibrium, a Luminous Efficacy (LER) of 361 lm/W$_{opt}$ and an overall luminous Efficacy (OLE) of 229 lm/W$_{dc}$. LED-filament Dev.7 generates white light with a CCT of about 6500K (6399K), a General CRI Ra of 80 and, after reaching thermal equilibrium, a Luminous Efficacy (LER) of 329 lm/W$_{opt}$ and an overall luminous Efficacy (OLE) of 222 lm/W$_{dc}$. As can be seen from Table 8, Duv for LED-filaments Dev.4 to Dev.7 according to the invention are respectively 0.0098, 0.0082, 0.0118, and 0.0140.

It is to be noted from Tables 7 and 8 that comparing the "Instant" and "Thermal" values that flux, power, OLE, LER, CCT, CIE y, Duv decrease while CRI Ra and CRI R9 increase.

TABLE 7

Measured characteristics of Single-layer structured
LED-filaments: Dev. 4 (2700 K), Dev. 5 (3000
K), Dev. 6 (4000 K), and Dev. 7 (6500 K)

| Device | Measurement | Flux (lm) | Power (mW) | LER (lm/W$_{opt}$) | OLE (lm/W$_{dc}$) |
|---|---|---|---|---|---|
| Dev. 4 | Instant | 129.9 | 599 | 367.9 | 217.0 |
| Dev. 5 | | 136.8 | 601 | 365.7 | 228.8 |
| Dev. 6 | | 139.8 | 602 | 363.9 | 232.3 |
| Dev. 7 | | 135.2 | 602 | 332.0 | 224.7 |
| Dev. 4 | Thermal | 127.4 | 596 | 366.2 | 213.9 |
| Dev. 5 | | 133.6 | 597 | 363.5 | 223.8 |
| Dev. 6 | | 136.7 | 598 | 361.4 | 228.8 |
| Dev. 7 | | 132.5 | 598 | 328.7 | 221.5 |

TABLE 8

Measured characteristics of Single-layer
structured LED-filaments: Dev. 4 (2700K),
Dev. 5 (3000K), Dev. 6 (4000K), and Dev. 7 (6500K)

| Device | Measurement | CCT (K) | CIE Chromaticity 1931 x | 1931 y | 1976 Duv | CRI Ra | R9 |
|---|---|---|---|---|---|---|---|
| Dev. 4 | Instant | 2699 | 0.4788 | 0.4443 | 0.0103 | 80.8 | 9.9 |
| Dev. 5 | | 2851 | 0.4630 | 0.4366 | 0.0091 | 82.1 | 15.3 |
| Dev. 6 | | 3951 | 0.3925 | 0.4132 | 0.0128 | 79.4 | 4.8 |
| Dev. 7 | | 6372 | 0.3122 | 0.3532 | 0.0153 | 79.8 | 12.1 |
| Dev. 4 | Thermal | 2685 | 0.4789 | 0.4426 | 0.0098 | 81.1 | 11.3 |
| Dev. 5 | | 2835 | 0.4630 | 0.4342 | 0.0082 | 82.4 | 17.1 |
| Dev. 6 | | 3939 | 0.3923 | 0.4108 | 0.0118 | 80.0 | 7.9 |
| Dev. 7 | | 6399 | 0.3120 | 0.3501 | 0.0140 | 81.1 | 19.0 |

Double-Layer Structured LED-Filaments

Double-layer structured high luminous efficacy LED-filaments in accordance with the invention (Dev.8 to Dev.12) each comprise a 52 mm by 1.5 mm porous ceramic (silica)

substrate with a transmittance ∞40% having thirty eight serially connected 1128 (11 mil×28 mil—chip area 0.47 mm²) blue LED chips of dominant wavelength $\lambda_d$=456 nm mounted on a front face. The LED-filaments are nominal 0.5 W devices and are intended to generate white light with a target CCT of 2700K (Dev.8), 3000K (Devs.9 and 10), 4000K (Dev.11), and 6500K (Dev.12). LED-filaments Dev.8, Dev.9 and Dev.11, Dev.12 are configured to generate white light with general color rendering index CRI Ra of about 80 while Dev.10 is configured to generate white light with general color rendering index CRI Ra of about 90.

For the double-layer LED-filaments, the narrowband red phosphor (KSF) was mixed with a silicone encapsulant material and the mixture dispensed as a strip (first layer) onto the front face of the substrate covering the LED chips. The broadband green (YAG543) and red (CASN615) phosphors were mixed in a silicone and the mixture dispensed on the front face of the substrate as a second layer that covers the first layer and front face of the substrate (FIGS. 4a to 4d). On the back face, broadband red (CASN615) and green (YAG543) phosphors were mixed in a silicone encapsulant material and the mixture dispensed onto back face of the substrate.

Tables 9 and 10 tabulate measured characteristics of double-layer structured LED-filaments, Dev.8 to Dev.12. Data measurements are "Instant" values on power-on of the device. All data are for (drive) conditions $I_F$=5 mA (current density 25 mA/mm²), $V_F$∞100V (500 mW).

As can be seen from the Tables 9 and 10 LED-filament Dev.8 generates white light with a CCT of about 2700K (2808K), a General CRI Ra of 80, a Luminous Efficacy (LER) of 369 lm/$W_{opt}$ and an Overall Luminous Efficacy (OLE) of 224 lm/$W_{dc}$. LED-filament Dev.9 generates white light with a CCT of about 3000K (3092K), a General CRI Ra of about 80, a Luminous Efficacy (LER) of 374 lm/$W_{opt}$ and an Overall Luminous Efficacy (OLE) of 230 lm/$W_{dc}$. LED-filament Dev.10 generates white light with a CCT of about 3000K (3173K), a General CRI Ra of 90, a Luminous Efficacy (LER) of 363 lm/$W_{opt}$ and an Overall Luminous Efficacy (OLE) of 225 lm/$W_{dc}$. LED-filament Dev.11 generates white light with a CCT of about 4000K (4157K), a General CRI Ra of 80, a Luminous Efficacy (LER) of 360 lm/$W_{opt}$ and an Overall Luminous Efficacy (OLE) of 232 lm/$W_{dc}$. LED-filament Dev.12 generates white light with a CCT of about 6500K (7006K), a General CRI Ra of 80, a Luminous Efficacy (LER) of 323 lm/$W_{opt}$ and an Overall Luminous Efficacy (OLE) of 222 lm/$W_{dc}$. As can be seen from Table 10, Duv for LED-filaments Dev.8 to Dev.12 according to the invention are respectively 0.0107, 0.0134, 0.0121, 0.0124, and 0.0169.

As described herein, a particular advantage of a double-layer photoluminescence structure is that he amount/usage of a manganese-activated fluoride phosphor required to achieve a target color point can be significantly reduced (up to 60%) compared with a single-layer photoluminescence structure providing a substantial reduction in manufacturing cost since manganese-activated fluoride phosphor is many times more expensive than broadband green to yellow and broadband orange to red phosphors.

As described herein the WPE of the LED chip can be increased by under-driving the LED chip in terms of current density. Comparing data for the double-layer and single-layer LED-filaments (Comparing Tables 9 and 10 with Tables 7 and 8—Instant), it can be seen that this that the double-layer filaments have an OLE that is about 3% higher that the single-layer LED filaments. This difference in OLE is primarily attributable to the difference in the current density at which the LED-filaments are operated rather that the structure of the LED-filament (single-layer LED-filaments were operated with a current density of 30 mA/mm² while double-layer LED-filaments were operated at 25 mA/mm²). For comparison current white light emitting devices are operated at a current density of about 180 mA/mm²).

TABLE 9

Measured characteristics of double-layer structured LED-filaments: Dev. 8 (2700 K), Devs. 9 and 10 (3000 K), Dev. 11 (4000 K) and Dev. 12 (6500 K)

| Device | Flux (lm) | LER (lm/$W_{opt}$) | OLE (lm/$W_{dc}$) |
|---|---|---|---|
| Dev. 8 | 112 | 369.0 | 224 |
| Dev. 9 | 115 | 373.7 | 230 |
| Dev. 10 | 112 | 363.1 | 225 |
| Dev. 11 | 116 | 360.1 | 232 |
| Dev. 12 | 111 | 323.1 | 222 |

TABLE 10

Measured characteristics of Double-layer structured LED-filaments Dev. 8 (2700K), Devs. 9 and 10 (3000K), Dev. 11 (4000K) and Dev. 12 (6500K)

| Device | CCT (K) | CIE Chromaticity 1931 x | CIE Chromaticity 1931 y | 1976 Duv | CRI Ra | CRI R9 |
|---|---|---|---|---|---|---|
| Dev. 8 | 2808 | 0.4694 | 0.4427 | 0.0107 | 80.8 | 8.2 |
| Dev. 9 | 3092 | 0.4502 | 0.4443 | 0.0134 | 80.0 | 5.6 |
| Dev. 10 | 3173 | 0.4420 | 0.4376 | 0.0121 | 90.1 | 58.7 |
| Dev. 11 | 4157 | 0.3817 | 0.4052 | 0.0124 | 79.3 | −1.2 |
| Dev. 12 | 7006 | 0.3006 | 0.3445 | 0.0169 | 79.6 | −10.9 |

Double-Layer Structured LED-Filaments

Double-layer structured high luminous efficacy LED-filament in accordance with the invention (Dev.13 and Dev.14) each comprising a 52 mm by 3.0 mm porous ceramic (silica) substrate with a transmittance 40% having thirty eight serially connected 1128 (11 mil×28 mil—chip area 0.47 mm²) blue LED chips of dominant wavelength $\lambda_d$=456 nm mounted on a front face. The LED-filaments are nominal 0.5 W devices and are intended to generate white light with a target CCT of 3000K and are configured to generate white light with general color rendering index CRI Ra of about 80.

For the double-layer LED-filaments, the narrowband red phosphor (KSF) was mixed with a silicone encapsulant material and the mixture dispensed as a strip (first layer) onto the front face of the substrate covering the LED chips. The broadband green (YAG543-Dev.13, YAG551-Dev.14) and red (CASN615) phosphors were mixed in a silicone and the mixture dispensed on the front face of the substrate as a second layer that covers the first layer and front face of the substrate (FIGS. 4a to 4d). On the back face, broadband red (CASN615) and green (YAG543) phosphors were mixed in a silicone encapsulant material and the mixture dispensed onto back face of the substrate.

Tables 11 and 12 tabulate measured characteristics of double-layer structured LED-filaments, Dev.13 and Dev.14. Data measurements are "Instant" values on power-on of the device. All data are for (drive) conditions $I_F$=5 mA (current density 25 mA/mm²), $V_F$∞100V (500 mW).

23                                                         24

As can be seen from the Tables 11 and 12 LED-filament Dev.13 generates white light with a CCT of about 3000K (3004K), a General CRI Ra of about 80 (80.8), a CRI R8 of about 64 (64.2), a CRI R9 of about 10 (9.5), a Luminous Efficacy (LER) of 368 lm/W$_{opt}$ and an Overall Luminous Efficacy (OLE) of about 228 lm/W$_{dc}$. LED-filament Dev.14 generates white light with a CCT of about 3000K (3015K), a General CRI Ra of about 80 (82.5), a CRI R8 of about 75 (74.6), a CRI R9 of about 30, a Luminous Efficacy (LER) of 368 lm/W$_{opt}$ and an Overall Luminous Efficacy (OLE) of about 230 lm/W$_{dc}$. As can be seen from Table 12, Duv for LED-filaments Dev.13 and Dev.14 according to the invention are respectively 0.0099 and 0.0103.

TABLE 11

Measured characteristics of double-layer structured LED-filaments: Dev. 13 (3000 K) and Dev. 14 (3000 K)

| Device | Flux (lm) | LER (lm/W$_{opt}$) | OLE (lm/W$_{dc}$) |
|---|---|---|---|
| Dev. 13 | 113 | 368 | 227.6 |
| Dev. 14 | 114 | 368 | 230.3 |

TABLE 12

Measured characteristics of double-layer structured LED-filaments: Dev. 13 (3000K) and Dev. 14 (3000K)

| | | CIE Chromaticity | | | | |
|---|---|---|---|---|---|---|
| | CCT | 1931 | | 1976 | | CRI |
| Device | (K) | x | y | Duv | Ra | R8 | R9 |
| Dev. 13 | 3004 | 0.4519 | 0.4354 | 0.0099 | 80.8 | 64.2 | 9.5 |
| Dev. 14 | 3015 | 0.4516 | 0.4363 | 0.0103 | 82.5 | 74.6 | 30.0 |

LIST OF REFERENCE NUMERALS

10 White light emitting device
12 LED chip
14 Package
16 Upper body portion
18 Lower body portion
20 Cavity
22, 24 Electrical contacts
26, 28 Electrode contact pads
30 Thermally conductive pad
32, 34 Wire bonds
36 Single-layer photoluminescence material structure
38 Double-layer photoluminescence material structure— First layer
40 Double-layer photoluminescence material structure— Second layer
42 Substrate
44 Annular wall
46 Substrate—Front face
48 Substrate—Back face
50 Wire bond
52 Second Single-layer photoluminescence material structure
54c Blue peak—comparative device Com.#\
54d Blue peak—device Dev.#
56c Green feature/peak—comparative device Com.#
56d Green feature/peak—device Dev.#
58c Red feature/peak—comparative device Com.

58d Red feature/peak—device Dev.#
60 Multiple narrowband peak

Acronyms

ANSI American National Standards Institute
CASN Calcium Aluminum Silicon Nitride
CCT Correlated Color Temperature
CE Conversion Efficiency
CIE International Commission on Illumination
CRI or CRI Ra General Color Rendering Index
CRI R9 Color Rendering Index of color sample R9
FWHM Full Width at Half Maximum
LE Luminous Efficacy
LER Luminous Efficacy of Radiation
LuAG Lutetium Aluminum Garnet
OLE Overall Luminous Efficacy
QE Quantum Efficiency
SE Stokes Efficiency
WPE Wall-Plug Efficiency
YAG Yttrium Aluminum Garnet

What is claimed is:

1. A white light emitting device comprising:
an LED for generating excitation light of wavelength from 420 nm to 480 nm; and
photoluminescence materials for generating light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm;
wherein the device is for generating white light with a selected color temperature from 2200K to 6500K, a General Color Rendering Index, CRI Ra, of at least 80, and a CIE 1976 Duv from 0.0060 to 0.0170 for the selected color temperature; and
wherein the device has an LER (Luminous Efficacy of Radiation) of at least 320 lm/W$_{opt}$.

2. The white light emitting device of claim 1 wherein:
when the selected color temperature is about 2700K, the device has an LER of at least 360 lm/W$_{opt}$;
when the selected color temperature is about 3000K, the device has an LER of at least 355 lm/W$_{opt}$;
when the selected color temperature is about 4000K, the device has an LER of at least 350 lm/W$_{opt}$; and
when the selected color temperature is about 6500K, the device has an LER of at least 320 lm/W$_{opt}$.

3. The white light emitting device of claim 1, wherein the device is for generating white light with a CRI R8 of at least 72.

4. The white light emitting device of claim 1, comprising a single-layer photoluminescence structure comprising a photoluminescence layer covering the LED and comprising the broadband phosphor and the manganese-activated narrowband red fluoride phosphor.

5. The white light emitting device of claim 1, comprising a double-layer photoluminescence structure comprising:
a first photoluminescence layer covering a light emitting face the LED and consisting of the manganese-activated narrowband red fluoride phosphor; and
a second photoluminescence layer comprising the broadband phosphor, wherein the second photoluminescence layer encapsulates the first photoluminescence layer.

6. The white light emitting device of claim 1, wherein the LED is operated at a current density from 20 mA/mm$^2$ to 120 mA/mm$^2$.

7. The white light emitting device of claim 1, wherein the manganese-activated narrowband red fluoride phosphor comprises at least one of: $K_2SiF_6$:$Mn^{4+}$, $K_2TiF_6$:$Mn^{4+}$, and $K_2GeF_6$:$Mn^{4+}$.

8. The white light emitting device of claim 1, wherein the broadband phosphor comprises at least one of:
   a broadband green to yellow phosphor comprising an yttrium aluminum garnet phosphor or a lutetium aluminum garnet phosphor, and
   a broadband orange to red phosphor comprising a calcium aluminum silicon nitride phosphor.

9. A white light emitting device comprising:
   an LED for generating excitation light of wavelength from 420 nm to 480 nm; and
   photoluminescence materials for generating light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm;
   wherein the device is for generating white light with a selected color temperature from 2200K to 6500K, a General Color Rendering Index, CRI Ra, of at least 80, and a CIE 1976 Duv from 0.0060 to 0.0170 for a selected color temperature; and
   wherein the device has an OLE (Overall Luminous Efficacy) of at least 210 $lm/W_{dc}$.

10. The white light emitting device of claim 9, wherein:
   when the selected color temperature is about 2700K, the device has an OLE of at least 210 $lm/W_{dc}$;
   when the selected color temperature is about 3000K, the device has an OLE of at least 220 $lm/W_{dc}$;
   when the selected color temperature is about 4000K, the device has an OLE of at least 225 $lm/W_{dc}$; and
   when the selected color temperature is about 6500K, the device has an OLE of at least 220 $lm/W_{dc}$.

11. The white light emitting device of claim 9, wherein the device is for generating white light with a CRI R8 of at least 72.

12. The white light emitting device of claim 9, comprising a single-layer photoluminescence structure comprising a photoluminescence layer covering the LED and comprising the broadband phosphor and the manganese-activated narrowband red fluoride phosphor.

13. The white light emitting device of claim 9, comprising a double-layer photoluminescence structure comprising:
   a first photoluminescence layer covering a light emitting face the LED and consisting of the manganese-activated narrowband red fluoride phosphor; and
   a second photoluminescence layer comprising the broadband phosphor, wherein the second photoluminescence layer encapsulates the first photoluminescence layer.

14. The white light emitting device of claim 9, wherein the LED is operated at a current density from 20 $mA/mm^2$ to 90 $mA/mm^2$.

15. The white light emitting device of claim 9, wherein the manganese-activated narrowband red fluoride phosphor comprises at least one of: $K_2SiF_6$:$Mn^{4+}$, $K_2TiF_6$:$Mn^{4+}$, and $K_2GeF_6$:$Mn^{4+}$.

16. The white light emitting device of claim 9, wherein the broadband phosphor comprises at least one of:
   a broadband green to yellow phosphor comprising an yttrium aluminum garnet phosphor or a lutetium aluminum garnet phosphor, and
   a broadband orange to red phosphor comprising a calcium aluminum silicon nitride phosphor.

17. An LED-filament comprising:
   an at least partially light transmissive substrate having a front face;
   a linear array of LED chips on the front face of the substrate for generating excitation light of wavelength from 420 nm to 480 nm; and
   photoluminescence materials for generating light with a peak emission wavelength from 500 nm to 650 nm comprising a broadband phosphor, and a manganese-activated narrowband red fluoride phosphor with a peak emission wavelength from 628 nm to 640 nm and a full width at half maximum of less than 30 nm;
   wherein the LED-filament is for generating white light with a selected color temperature from 2200K to 6500K, a General Color Rendering Index, CRI Ra, of at least 80, and a CIE 1976 Duv from 0.0060 to 0.0170 for the selected color temperature and wherein the device has an OLE (Overall Luminous Efficacy) of at least 210 $lm/W_{dc}$.

18. The LED-filament of claim 17, wherein:
   when the selected color temperature is about 2700K, the LED-filament has an OLE of at least 210 $lm/W_{dc}$;
   when the selected color temperature is about 3000K, the LED-filament has an OLE of at least 220 $lm/W_{dc}$;
   when the selected color temperature is about 4000K, the LED-filament has an OLE of at least 225 $lm/W_{dc}$; and
   when the selected color temperature is about 6500K, the LED-filament has an OLE of at least 220 $lm/W_{dc}$.

19. The LED-filament of claim 17, comprising a double-layer photoluminescence structure comprising on the front face of the substrate, the double-layer photoluminescence structure comprising:
   a first photoluminescence layer consisting of the manganese-activated narrowband red fluoride phosphor, wherein the first photoluminescence layer is a continuous unbroken elongate strip that encapsulates every LED chip on the substrate; and
   a second photoluminescence layer comprising the broadband phosphor, wherein the second photoluminescence layer is a continuous unbroken elongate strip that encapsulates the first photoluminescence layer.

* * * * *